United States Patent
Tatsuzawa et al.

(10) Patent No.: US 7,371,783 B2
(45) Date of Patent: May 13, 2008

(54) ALKALI-SOLUBLE MALEIMIDE COPOLYMER AND LIQUID CRYSTAL DISPLAY COMPRISING THE SAME

(75) Inventors: Masahiro Tatsuzawa, Tokyo (JP); Kiyoshi Ito, Tokyo (JP); Shinji Hayashi, Tokyo (JP); Shunsuke Sega, Tokyo (JP); Tomonobu Sumino, Tokyo (JP); Minoru Yamaguchi, Ibaraki (JP); Tomomasa Kaneko, Kyoto (JP); Kenichi Ueda, Suita (JP)

(73) Assignees: Nippon Shokubai Co., Ltd., Osaka (JP); Dainippon Printing Co., Ltd., Shinjuku-ku (JP)

( * ) Notice: Subject to any disclaimer, the term of this patent is extended or adjusted under 35 U.S.C. 154(b) by 111 days.

(21) Appl. No.: 10/490,658

(22) PCT Filed: Sep. 24, 2002

(86) PCT No.: PCT/JP02/09780

§ 371 (c)(1),
(2), (4) Date: Oct. 4, 2004

(87) PCT Pub. No.: WO03/027156

PCT Pub. Date: Apr. 3, 2003

(65) Prior Publication Data

US 2005/0074563 A1    Apr. 7, 2005

(30) Foreign Application Priority Data

Sep. 25, 2001  (JP)  ............... 2001-292075
Mar. 29, 2002  (JP)  ............... 2002-098068

(51) Int. Cl.
*C08F 2/46*   (2006.01)
*C08F 20/52*  (2006.01)
*G03C 1/00*   (2006.01)

(52) U.S. Cl. .................. 522/176; 522/182; 522/152; 522/151; 522/150; 522/63; 522/26; 522/16; 522/121; 522/73; 526/89; 526/204; 526/205; 526/303.1; 526/307.4; 526/307.7; 430/269; 430/270.1; 430/208.1; 430/281.1; 430/285.1; 430/286.1; 430/288.1

(58) Field of Classification Search .............. 522/73, 522/121, 16, 26, 63, 150, 151, 152, 173, 522/176, 182; 430/269, 270.1, 280.1, 281.1, 430/285.1, 286.1, 288.1; 526/89, 204, 205, 526/303.1, 307.4, 307.6, 307.7
See application file for complete search history.

(56) References Cited

U.S. PATENT DOCUMENTS 6,028,123 A   2/2000  Hirayama et al.
6,120,973 A   9/2000  Itano et al.

FOREIGN PATENT DOCUMENTS

| | | |
|---|---|---|
| JP | 03-289655 | 12/1991 |
| JP | 4-272976 | 9/1992 |
| JP | 4-272977 | 9/1992 |
| JP | 4-315101 | 11/1992 |
| JP | 6-67417 | 3/1994 |
| JP | 9-106071 | 4/1997 |
| JP | 9-311211 | 12/1997 |
| JP | 10-31308 | 2/1998 |
| JP | 10-060214 | 3/1998 |
| JP | 10-260310 | 9/1998 |
| JP | 10-300922 | 11/1998 |
| JP | 11-15147 | 1/1999 |
| JP | 2001-64337 | 3/2001 |
| JP | 2001-142082 A | 5/2001 |

*Primary Examiner*—Sanza L. Mcclendon
(74) *Attorney, Agent, or Firm*—Connolly Bove Lodge and Hutz

(57) ABSTRACT

Provided is an alkali-soluble maleimide-based copolymer which comprises, as essential constituents, 5 to 50% by mass of a maleimide monomer unit which is at least one unit selected from the group consisting of a N-cyclohexylmaleimide monomer unit, a N-benzylmaleimide monomer unit and a substituted N-benzylmaleimide monomer unit, 8 to 30% by mass of the (meth)acrylic acid monomer unit and 30 to 87% by mass of a (meth)acrylic acid ester monomer unit and which satisfies the condition represented by the formula:

$$0.4 \times X \leq Y \leq 0.5 \times X + 10$$

where X is the content, in % by mass, of the N-cyclohexylmaleimide monomer unit, the N-benzylmaleimide monomer unit and the substituted N-benzylmaleimide monomer unit and Y is the content, in % by mass, of the (meth)acrylic acid monomer unit. Also provided are a color filter and a liquid crystal display which are formed by using the ionizing radiation-curable resin composition.

21 Claims, 1 Drawing Sheet

ALKALI-SOLUBLE MALEIMIDE COPOLYMER AND LIQUID CRYSTAL DISPLAY COMPRISING THE SAME

FIELD OF THE INVENTION

The present invention relates to an alkali-soluble maleimide-based copolymer, a pigment dispersion composition, an ionizing radiation-curable resin composition, a color filter, and a liquid crystal display. More particularly, it relates to an alkali-soluble maleimide-based copolymer capable of serving as a constituent element of pigment dispersion compositions or ionizing radiation-curable resin compositions, to a pigment dispersion composition or ionizing radiation-curable resin composition suited for use in forming thin film layers or fine patterns, such as color filters, to a color filter whose thin film layer such as a colored layer, a protective layer and/or a spacer, or whose fine pattern is formed of such resin composition, and to a liquid crystal display assembled by using such color filter.

PRIOR ART

Maleimide-based copolymers have a high glass transition temperature and can show improved thermal characteristics and, therefore, have attracted attention in the field of electronics resins, such as electron materials and substrate materials, among others. In such field, materials resistant to yellowing and other degradative changes upon exposure to heat in the process of assembling electric or electronic parts are required, and maleimide-based copolymers are suited for use. In recent years, the demand for polymers to serve as constituent elements of ionizing radiation-curable resin compositions for use in forming thin film layers or fine patterns, such as color filters constituting liquid crystal panels has been increasing rapidly. Accordingly, maleimide-based copolymers applicable in such field have been searched for.

A liquid crystal panel has a structure such that a display side substrate and a liquid crystal driving side substrate are opposed to each other with a liquid crystal compound being sealed between both substrates to form a thin liquid crystal layer. In a liquid crystal display with such a liquid crystal panel incorporated therein, displaying is carried out by electrically controlling the orientation of the liquid crystal in the liquid crystal layer through the liquid crystal driving side substrate of the liquid crystal panel to thereby selectively vary the transmitted light amount or reflected light amount on the display substrate side. As far as such liquid crystal panel is concerned, color liquid crystal display have become popularized rapidly in recent years in which an active matrix system or simple matrix system liquid crystal panel is used.

FIG. 1 shows a constitution example of an active matrix system liquid crystal panel. The liquid crystal panel 101 has a structure such that a color filter 1, which is the display side substrate, and a TFT array substrate (electrode substrate) 2, which is the liquid crystal driving side substrate are opposed to each other with a gap 3, about 1 to 10 µm in width, being formed between them, and that the gap 3 is filled with a liquid crystal L and sealed around with a sealing material 4. The color filter 1 has a structure resulting from covering a transparent substrate 5 with a black matrix layer 6 with a predetermined pattern formed for shielding bordering portions between neighboring pixels, a colored layer (pixel part) 7 with a plural colors (generally three primary colors, i.e. red (R), green (G) and blue (B)) disposed in a predetermined order for forming pixels, a protective layer (protective film) 8 and a transparent electrode film 9 in that order from the transparent substrate side. On the other hand, the TFT array substrate 2 has a structure (not shown) resulting from arranging TFT devices on a transparent substrate and disposing a transparent electrode film. On the inner side each of the color filter 1 and the electrode substrate 2 opposing thereto, an alignment layer 10 is provided. Further, in the gap 3, there are pearls 11 having a predetermined diameter dispersed as spacers for maintaining the cell gap between the color filter 1 and electrode substrate 2 uniformly at a constant distance. By controlling the light transmittance of the liquid crystal layer behind the respective colored pixels, a color image is produced.

According to a method of maintaining the cell gap, a large number of spherical or rod-like particulate spacers 11 having a predetermined size and made of a glass or plastic material, for instance, are dispersed as spacers within the gap 3, as shown in FIG. 1, the color filter 1 and TFT array substrate 2 are subjected to panel alignment, and the gap is filled with a liquid crystal. When, however, fine particulate pearls 11 such as those shown in FIG. 1 are dispersed as spacers, the pearls are dispersed at random irrespective of whether the sites are behind the black matrix layer 6 or behind pixels. If a pearl is disposed in a display region, namely on a pixel part, the pearl reagion transmits the backlight light and the orientation of the liquid crystal around the pearl is disturbed and, as a result, the quality of the image displayed is markedly deteriorated. Therefore, it is a recent trend to form, on the inner side of the color filter, pillar-like spacers 12 having a height corresponding to the cell gap in regions overlapping with the sites where the black matrix layer 6 is formed, as shown in FIG. 2, instead of dispersing pearls.

The colored layer 7 contained in the structure of the color filter can be formed by the so-called pigment dispersion method, namely by preparing a photosensitive colored composition (ionizing radiation-curable colored resin composition) by incorporating one or two or more pigments selected so as to enable development of predetermined colors such as RGB in a photocurable resin composition (ionizing radiation-curable resin composition) comprising a binder resin, a photoinitiator and so on, applying the colored composition to the transparent substrate, drying the same, selectively exposing predetermined regions of the coat film obtained to light for attain curing, and developing with an organic solvent or an alkaline solution.

Meanwhile, for a liquid crystal display to manifest excellent display performance, the ability of pixels to express color spaces is important. It is required that the RGB pixels be color-matched so as to attain a sufficiently wide color reproduction range, which is defined by chromaticity coordinates (x, y) in the XYZ color model, and be excellent in transparency and color purity so as to accomplish a sufficiently high level of brightness, which is represented by the stimulus value Y. However, in the process of color filter production, a problem arises; namely, the binder resin contained in the colored layer undergoes yellowing, impairing the transparency or color characteristics. More specifically, the color filter is produced through such steps of heating at elevated temperatures as postbaking and aligned polyimide film formation and, when the colored layer-forming material yellows, absorption at wavelength around 400 nm is induced, causing a problem; the color characteristics of the colored layer deteriorate. When blue pixels, in particular, among the respective colors, are tinged with yellow, the transparency and/or color characteristics deteriorate and the luminance is also decreased most significantly. It is therefore very important to prevent blue pixels from yellowing.

Further, the fine pattern forming ability, such as developability and photoengraving characteristics, of the ionizing radiation-curable colored resin composition for colored layer formation also greatly influences on the display performance of liquid crystal displays. For making fine patterns, such as pixels, by the pigment dispersion method, the following performance characteristics, among others, are required in relation to the fine pattern forming ability: no residue, no fine line deficit, no remaining foreign matter, no surface roughening, high resolution, accuracy in shape or pattern after development, and uniform film thickness.

The term "residue" means a colored matter remaining, after development, at sites or places where it should be essentially absent. It readily occurs when the developability is poor due to abundance in pigment and/or dispersant, for instance. Fine line deficits tend to occur when the adherence is poor due to an insufficient curing component content in the ionizing radiation-curable colored resin composition or insufficient affinity for the substrate. Foreign matter, result from partial chipping of pixels, which occurs when the curing component content in the ionizing radiation-curable colored resin composition is insufficient, or from adhesion of colored pieces formed by the peeling phenomenon occurring when the amount of a developing component is not enough. Surface roughening is also caused when the curing component content in the ionizing radiation-curable colored resin composition is not enough.

As for the shape or pattern after development, a problem is that when the photosensitivity of the ionizing radiation-curable colored resin composition is poor, the pattern may become reversed trapezoidal (reversed tapered) in form. Such reversed trapezoidal forms after development facilitate chipping of upper portions of pixels due to water pressure, for instance, in the step of development, causing foreign matter formation. In addition, when the heat resistance is low, the eaves-like projecting edges of reversed trapezoidal coat films may hang down upon heating, deteriorating the resolution.

For forming fine patterns accurately using an ionizing radiation-curable colored resin composition, all these requirements should be satisfied. However, when the solubility of the photosensitive colored composition in the developer is increased to a level at which no residue will remain, there is developed a general tendency toward occurrence or formation of fine line deficits, foreign matter, and surface roughening, among others, hence it is very difficult to eliminate residues.

Furthermore, the mechanical and chemical characteristics of finished pixels are not only important to the mechanical durability or life of color filters and liquid crystal displays but also greatly influence the display performance thereof. The physical properties influencing the display performance include hardness, elasticity and impurity elution, among others.

Spacers, such as spherical spacers or pillar-like spacers, are disposed in a layer above the pixels or black matrix in some instances. When, in this case, the pixels are poor in hardness or elastic modulus, the foundation may deform and the cell gap uniformity is impaired accordingly however hard the spacers formed are. Thus, pixels, too, are required to be high in hardness and elastic modulus.

Impurity elution from pixels may cause contamination of the liquid crystal. Once contaminated with a small amount of an ionic impurity, the liquid crystal will no more perform its switching function and, therefore, it is important that any ionic molecules will not be eluted from the color filter into the liquid crystal layer. However, the pigment and dispersant used in forming pixels contain ionic molecules as impurities in many cases. Prevention of impurity elution from the colored layer is thus required.

The physical properties of pixels after curing can be improved by incorporating a sufficient amount of a curing component in the ionizing radiation-curable colored resin composition. However, incorporation of a large amount of a dispersant in order to increase the transparency of pixels by finely dispersing a pigment in the ionizing radiation-curable colored resin composition causes a reduction in curing component concentration and makes it impossible to improve the physical properties of the pixels. In addition, the use of a large amount of a dispersant causes a decrease in pigment concentration as well, leading to poor color reproducibility.

Referring to FIG. 1 and FIG. 2, the protective layer 8 is required to have such characteristics as transparency, adherence, strength, hardness, heat resistance, pattern accuracy, and coat film flatness. Considering the adherence and tightness of seals, the protective layer is preferably such that it can selectively cover those regions of the transparent substrate where the colored layer is formed. Like the colored layer, the protective layer is also required to show pattern accuracy, although such a fine pattern as that of the colored layer may not be formed. Furthermore, although pillar-like spacers 12, which are formed on the black matrix layer, are not required to be transparent, they are required to have the other characteristics common to those required of the colored layer and protective layer. These color filter-constituting colored layer and protective layer and, in particular, pillar-like spacers are required to have a sufficient hardness so that the liquid crystal layer may be maintained constant. The application of an ionizing radiation-curable resin composition containing a maleimide-based copolymer to the formation of such colored layer, protective layer and pillar-like spacers, among others, of color liquid crystal display has been under investigation. In this case, the ionizing radiation-curable resin composition is applied onto a substrate and cured by means of ionizing radiation according to a pattern, and the uncured portion thereof is removed with alkali water or the like for development.

Japanese Kokai Publication Hei-10-31308 is concerned with a photosensitive colored composition comprising, as a binder resin, a copolymer of N-substituted maleimide and an acid group-containing monomer and discloses, in the example section, the use of a binder resin obtained by reacting 60 parts by mass of cyclohexylmaleimide as the N-substituted maleimide, 20 parts by mass of methacrylic acid as an acid group-containing monomer and, further, 20 parts by mass of hydroxyethyl methacrylate in ethylcellosolve. However, there are problems; cyclohexylmaleimide accounts for an excessive proportion in the whole monomer and tends to partly remain at the time of completion of the reaction, the remaining maleimide monomer undergoes decomposition and discoloration, for instance, and, accordingly, the effects of the monomer cannot be fully produced. Further, in forming thin film layers or fine patterns, such as color filters, a resin composition is applied onto substrates by the spin coating method or the like and, on that occasion, a high-boiling solvent is used considering the balance in drying and like factors, since it is difficult to form uniform films using a low-boiling solvent. There is room for contrivance for dissolving the copolymer in such high-boiling solvent to a satisfactory extent.

Japanese Kokai Publication Hei-10-300922 is concerned with a radiation-sensitive composition for color filter which comprises an alkali-soluble resin composed of a copolymer of an N-substituted maleimide monomer and another monomer copolymerizable therewith and discloses, in an example, the use of an N-phenylmaleimide/methacrylic acid/styrene/benzyl methacrylate=30/20/20/30 (% by mass) copolymer. Japanese Kokai Publication Hei-11-15147 is concerned with a color image forming material comprising a polymer having a maleimide group-containing skeleton and discloses, in an example, the use of an N-phenylmaleimide-styrene-methacrylic acid resin (mole ratio: 3:4:2). However, these N-phenylmaleimide-containing copolymers have problems; they are low in solubility in solvents and are readily discolored upon heating.

Japanese Kokai Publication Hei-10-60214 is concerned with an acrylic resin composition for color filter in which an acrylic resin obtained by polymerizing a monomer mixture comprising 1 to 6% by mass of an α,β-ethylenically unsaturated carboxylic acid, 10 to 80% by mass of α,β-ethylenically unsaturated carboxylic acid ester and 5 to 30% by mass of an N-substituted maleimide is incorporated and discloses, in an example, the use of a polymer obtained from 19% by mass of N-cyclohexylmaleimide, 76.8% by mass of a (meth) acrylic acid ester and 4.2% by mass of acrylic acid. However, for using such polymer as a constituent element of an ionizing radiation-curable resin composition capable of forming a thin film layer or fine pattern, such as color filter, there is room for contrivance; the solubility in alkali water should be improved and the alkali developability and heat resistance and/or hardness should be compatible with. Thus, in color filter production, for instance, there are involved the steps of applying a resin composition onto a transparent substrate to form a coat film, exposing the film to light for patterning through a mask as necessary, and removing the unexposed and uncured portions by development treatment with alkali water. In this process, when the solubility in alkali water is not enough, sharp patterns can hardly be obtained and, if the solubility in alkali water is improved, the heat resistance and/or hardness will become insufficient. Thus, there is room for contrivance for producing higher quality color filters.

Further, as regards the process of applying these compositions onto substrates and curing them by means of ionizing radiations for forming patterns, followed by development, there is also room for contrivance for curing in lower ionization radiation doses and/or improving the pattern accuracy after development. Namely, if curing can be effected in a lower ionizing radiation dose, it will become possible to shorten the time of curing and improve the efficiency of the process and, if the pattern accuracy can be more improved, it will become possible to provide liquid crystal displays improved in performance and quality. Thus, there is room for contrivance in these respects.

Japanese Kokai Publication Hei-11-15147 is concerned with a color image forming material comprising a polymer having a maleimide group-containing skeleton and discloses that when the polymer is a carboxyl group-containing one, the photopolymerization sensitivity can be increased by adding and introducing an activated double bond to and into the carboxyl group. However, even with such material, there is room for contrivance for making it possible to efficiently produce liquid crystal displays improved in performance and quality by curing it in a reduced ionization radiation dose in the step of curing by adjusting the percentage of introduction of the activated double bond to thereby increase the reactivity of the activated double bond and efficiently improving the curability of the polymer having a maleimide group-containing skeleton or still more improving the pattern accuracy after development.

SUMMARY OF THE INVENTION

Developed in the light of the above state of the art, the present invention has for its object to provide an alkali-soluble maleimide-based copolymer excellent in resistance for thermally yellowing, high in hardness, excellent in solubility in solvents and capable of readily forming uniform coat films and, in addition, capable of being satisfactorily dissolved in alkali water when remaining uncured, as well as a pigment dispersion composition comprising such copolymer and an ionizing radiation-curable resin composition comprising such copolymer. Another object of the present invention is to provide a color filter and a liquid crystal display which are formed by using the ionizing radiation-curable resin composition.

The present inventors studied various maleimide-based copolymers and, in the course of the studies, noticed that when the copolymer comprises, as essential constituents, (1) a maleimide monomer unit which is at least one unit selected from the group consisting of a N-cyclohexylmaleimide monomer unit, a N-benzylmaleimide monomer unit and a substituted N-benzylmaleimide monomer unit, (2) a (meth) acrylic acid monomer unit and (3) a (meth)acrylic acid ester monomer unit, respectively in specific proportions, the heat resistance and hardness are improved mainly owing to the above (1), the solubility in solvents is improved owing to the above (3) and the uncured portion is soluble in alkali water. By appropriately selecting the quantitative relation between the above (1) in total and the above (2), they found that the above object can successfully be accomplished. They also found that when the double bond equivalent of such alkali-soluble maleimide-based copolymer is 300 to 100,000, the copolymer is excellent in curability upon exposure to doses of ionizing radiation and the pattern accuracy after development can be improved.

They also found that such alkali-soluble maleimide-based copolymer, which can function as a binder component, shows great pigment dispersing ability, that it is possible, by using such copolymer, to prepare a pigment dispersion composition excellent in dispersibility even at reduced dispersant addition levels, and that the alkali-soluble maleimide-based copolymer is excellent in affinity for blue pigments, among pigments, or for phthalocyanine pigments in use as blue or green pigments and, therefore, compositions excellent in transparency, color characteristics, fine pattern forming ability and ability to provide good film characteristics after curing can be obtained by combining such alkali-soluble maleimide-based copolymer and such pigments. They further found that such copolymer is excellent in transparency, resistance for yellowing and other color characteristics and therefore can very effectively be combined with blue pigments, whose color tone is markedly impaired by yellowing, and the resulting pigment dispersion composition is suited for use as a material in preparing ionizing radiation-curable colored resin compositions to be used as materials for forming color filters and the like, and that when a specific value is selected as the mixing ratio of the dispersant to the total amount of pigments in the pigment dispersion composition, namely the (dispersant/pigment) ratio, the composition becomes more suited for use as a material for forming color filters and the like.

Furthermore, they found that an ionizing radiation-curable resin composition comprising such alkali-soluble maleimide-based copolymer, a radical-polymerizable compound and a photoinitiator is excellent in adherence to the substrate surface, film strength and hardness, heat resistance, resistance for warm pure water (warm distilled water resistance), chemical resistance and other physical properties and in addition excellent in alkali developability and heat stability and, therefore, is useful in forming thin film layers or fine patterns such as color filters.

Furthermore, they found that color filters in which at least one of the colored layer, protective layer and spacer is made of such ionizing radiation-curable resin composition, or liquid crystal displays produced by using those color filters are excellent in pixel transparency, resistance for yellowing and other color characteristics, pattern accuracy, physical properties after curing such as hardness and elasticity and excellent in performance characteristics, such as display performance, owing to slightness in residue amount, hence can be of high quality. These findings have led to completion of the present invention.

The present invention thus provides an alkali-soluble maleimide-based copolymer which comprises, as essential constituents, 5 to 50% by mass of a maleimide monomer unit which is at least one unit selected from the group consisting of a N-cyclohexylmaleimide monomer unit, a N-benzylmaleimide monomer unit and a substituted N-benzylmaleimide monomer unit, 8 to 30% by mass of the (meth)acrylic acid monomer unit and 30 to 87% by mass of a (meth)acrylic acid ester monomer unit and which satisfies the condition represented by the formula:

$$0.4 \times X \leq Y \leq 0.5 \times X + 10$$

where X is the content, in % by mass, of the N-cyclohexylmaleimide monomer unit, the N-benzylmaleimide monomer unit and the substituted N-benzylmaleimide monomer unit and Y is the content, in % by mass, of the (meth)acrylic acid monomer unit.

DETAILED DESCRIPTION OF THE INVENTION

In the following, the present invention is described in detail.

The alkali-soluble maleimide-based copolymer of the present invention comprises, as essential constituents, (1) 5 to 50% by mass of the maleimide monomer unit which is at least one unit selected from the group consisting of the N-cyclohexylmaleimide monomer unit, the N-benzylmaleimide monomer unit and the substituted N-benzylmaleimide monomer unit, (2) 8 to 30% by mass of the (meth)acrylic acid monomer unit and (3) 30 to 87% by mass of the (meth)acrylic acid ester monomer unit.

These monomer units each may comprise one single species or two or more species. However, when the proportions, on the mass basis, thereof are outside the above ranges, the effects of the respective monomer units cannot be produced. In preferred embodiments, the above mass ranges are 10 to 45% by mass for (1), 10 to 25% by mass for (2) and 30 to 80% by mass for (3) and, most preferably, 15 to 40% by mass for (1), 15 to 25% by mass for (2) and 35 to 70% by mass for (3). The above mass ranges are based on the mass of the alkali-soluble maleimide-based copolymer, which is taken as 100% by mass. The composition of the copolymer can be determined by assaying the unreacted monomers remaining at the time of completion of polymerization by gas chromatography, for instance.

In the practice of the present invention, the alkali-soluble maleimide-based copolymer may comprise one or more additional monomer units other than the above essential monomer units. However, the total mass proportion of the above essential monomer units is preferably not less than 50% by mass, more preferably not less than 70% by mass, still more preferably not less than 90% by mass.

As regards the mode of arrangement of the monomer units in the above alkali-soluble maleimide-based copolymer, the copolymer may be a random copolymer, an alternating copolymer, a block copolymer, or the like.

The alkali-soluble maleimide-based copolymer of the present invention satisfies the condition represented by the formula:

$$0.4 \times X \leq Y \leq 0.5 \times X + 10$$

where X is the content, in % by mass, of the N-cyclohexylmaleimide monomer unit, the N-benzylmaleimide monomer unit and the substituted N-benzylmaleimide monomer unit, namely the total amount of N-cyclohexylmaleimide monomer unit, the N-benzylmaleimide monomer unit and the substituted N-benzylmaleimide monomer unit, and Y is the content, in % by mass, of the (meth)acrylic acid monomer unit.

The alkali-soluble maleimide-based copolymer of the present invention, which satisfies the above condition, holds a balance between the solubility in alkali water and the heat resistance and/or hardness and, in addition, is excellent in solubility in solvents and thus can suitably be applied in preparing ionizing radiation-curable resin compositions. Thus, the ionizing radiation-curable resin compositions containing the alkali-soluble maleimide-based copolymer of the present invention are excellent in resistance for thermally yellowing and high in hardness and, in addition, are excellent in solubility in solvents and can readily form uniform coat films and, furthermore, they are excellent in alkali developability since the uncured portions thereof are sufficiently dissolved in alkali water. When Y is smaller than $0.4 \times X$, the solubility in alkali water will be low and, when Y exceeds $0.5 \times X + 10$, the heat resistance and/or hardness will become unsatisfactory. Reductions in these characteristics result in decreases in developability and/or deterioration of the coat film surface condition.

In a preferred embodiment of the present invention, the condition $0.45 \times X \leq Y \leq 0.5 \times X + 8$, more preferably $0.5 \times X \leq Y \leq 0.5 \times X + 7$, should be satisfied.

The alkali-soluble maleimide-based copolymer of the present invention preferably comprises, in addition to the above essential monomer units, a monomer unit capable of providing ionizing radiation curability (crosslinkability) or, in other words, it is preferred that the alkali-soluble maleimide-based copolymer of the present invention itself have ionizing radiation curability. This makes it possible to improve the sensitivity, to ionizing radiation, of the ionizing radiation-curable resin composition containing the alkali-soluble maleimide-based copolymer of the present invention. Thus, the ionizing radiation-curable resin composition becomes excellent in ionizing radiation curability, so that the curing time can efficiently be shortened and, in addition, the pattern accuracy after development can be improved.

The alkali-soluble maleimide-based copolymer of the present invention preferably has a double bond equivalent of 300 to 100,000. When this equivalent is less than 300, the double bond content is excessive, hence the curing becomes excessive, with the result that the curing shrinkage increases, the adherence to the substrate decreases accordingly, and the molecular weight increases with the lapse of time, leading to decreased storage stability and possibly to gelation. As mentioned later herein, a compound having an oxirane ring and a copolymerizable double bond is preferably used to introduce the double bond into the copolymer. In this case, however, if the hydroxyl group resulting from opening of the oxirane ring remains in a large amount, the hydrophilicity may become excessive, possibly causing roughening of the film surface and whitening of the film after development. Furthermore, such alkali-soluble maleimide-based copolymer is difficult to produce. When the above equivalent exceeds 100,000, the double bond content is too low and, when development is carried out at a low light exposure level, the curing may not proceed to a sufficient extent, hence the developability may become unsatisfactory and/or the film surface may be roughened. Furthermore, in color filter production, the production efficiency may decline and/or the pattern accuracy may decrease. When the double bond equivalent is within the above mentioned range, development becomes possible at a low light exposure level, for example at 50 mJ/cm$^2$, and hard films can be obtained thereby. The double bond equivalent is preferably within the range of 300 to 10,000, more preferably 300 to 3,000, still more preferably 300 to 2,000, especially preferably 400 to 2,000, most preferably 450 to 1,000. The double bond equivalent is the weight average molecular weight per double bond in the alkali-soluble maleimide-based copolymer.

While the above alkali-soluble maleimide-based copolymer preferably contains a double bond-containing monomer unit, the double bond-containing monomer unit may be any of the monomer units mentioned above. The proportion, by mass, of the double bond-containing monomer unit is appropriately selected so that the double bond equivalent of the alkali-soluble maleimide-based copolymer may be within the above range and, preferably, is not less than 1% by mass, but not more than 60% by mass, with the alkali-soluble maleimide-based copolymer being taken as 100% by mass. More preferably not less than 5% by mass, but not more than 50% by mass, still more preferably not more than 40% by mass, most preferably not more than 35% by mass. The double bond in question is preferably a copolymerizable double bond and preferably occurs on side chains of the alkali-soluble maleimide-based copolymer. In this situation, the double bond owned by the alkali-soluble maleimide-based copolymer can fully contribute to ionizing radiation curability and, accordingly, the sensitivity, to ionizing radiation, of the ionizing radiation-curable resin composition can be improved to a satisfactory extent. Thus, the ionizing radiation-curable resin composition becomes excellent in curability upon exposure to ionizing radiation, so that the curing time can be shortened and the curing efficiency can be improved and, in addition, the pattern accuracy after development can be improved to a satisfactory extent.

As regards the method of production, the alkali-soluble maleimide-based copolymer of the present invention can be produced by copolymerizing a monomer composition comprising, as essential constituents, the maleimide monomer which is at least one monomer selected from the group consisting of the N-cyclohexylmaleimide monomer, N-benzylmaleimide monomer and substituted N-benzylmaleimide monomer, (meth)acrylic acid monomer and (meth)acrylic acid ester monomer, whereby the corresponding monomer units are formed from the above monomers. In this case, the proportions, on the mass basis, of the respective monomers in the monomer composition are appropriately selected so that the proportions, on the mass basis, of the respective monomer units in the alkali-soluble maleimide-based copolymer may fall within the above-specified respective ranges. Since the alkali-soluble maleimide-based copolymer of the present invention may contain a monomer unit other than the above-mentioned essential monomer units, the monomer composition may contain one or more monomers other than the above essential monomers accordingly.

Suited for use as the N-benzylmaleimide monomer and substituted N-benzylmaleimide monomer are benzylmaleimide; alkyl-substituted benzylmaleimides such as p-methylbenzylmaleimide and p-butylbenzylmaleimide; phenolic hydroxyl-substituted benzylmaleimides such as p-hydroxybenzylmaleimide; halogen-substituted benzylmaleimides such as o-chlorobenzylmaleimide, o-dichlorobenzylmaleimide and p-dichlorobenzylmaleimide; and other N-benzylmaleimide monomers having a substituent on the benzyl group.

Suited for use as the (meth)acrylic acid monomer are acrylic acid and methacrylic acid. Suited for use as the (meth)acrylic acid ester monomer are methyl (meth)acrylate, ethyl (meth)acrylate, propyl (meth)acrylate, butyl (meth)acrylate and 2-ethylhexyl (meth)acrylate. The term "(meth)acrylic acid" means either of acrylic acid and methacrylic acid. The unit resulting from addition of glycidyl (meth)acrylate or the like to (meth)acrylic acid, which is to be mentioned later herein, is of course included among the category of (meth)acrylic acid ester monomers.

Suited for use as the monomer other than the above-mentioned essential monomers are aromatic-substituted maleimides such as phenylmaleimide; alkyl-substituted maleimides such as isopropylmaleimide; aromatic vinyl monomers such as styrene and α-methylstyrene; cyanovinyl compounds such as acrylonitrile and methacrylonitrile; and unsaturated dicarboxylic acid anhydrides such as maleic anhydride.

In a preferred mode of production of the alkali-soluble maleimide-based copolymer of the present invention, the monomer compositions are judiciously polymerized using a radical polymerization initiator, if necessary together with a molecular weight modifier. In this case, the polymerization can be carried out in the manner of bulk polymerization, solution polymerization, suspension polymerization, dispersion polymerization, emulsion polymerization, or an appropriate combination of these. Among these, solution polymerization is preferred. More preferably, the polymerization is carried out in the manner of batchwise solution polymerization.

In producing the alkali-soluble maleimide-based copolymer of the present invention, the radical polymerization initiator and the polymerization conditions may be appropriately selected according to the method of polymerization, the kind of monomers to be copolymerized and the proportions thereof, and other factors. The solvent to be used in carrying out the polymerization in the manner of solution polymerization may be any of those liquids which will not affect the solution polymerization but can dissolve both the monomer composition, which is the raw material, and the alkali-soluble maleimide-based copolymer, which is the product. Thus usable are aliphatic alcohols containing 1 to 3 carbon atoms, such as methanol, ethanol and glycol; cellosolves such as butyl cellosolve; carbitols such as butyl carbitol; esters such as propylene glycol monomethyl ether acetate; ethers such as diethylene glycol dimethyl ether; ketones such as cyclohexanone and methyl ethyl ketone; and like organic solvents. These may be used singly or two or more of them may be used in combination. The amount of the solvent to be used in solution polymerization is preferably 20 to 400% by mass relative to 100% by mass of the whole monomer composition. When it is less than 20% by mass, sufficient stirring may become difficult to perform at the time of completion of the polymerization due to viscosity increase and, when it exceeds 400% by mass, the molecular weight of the alkali-soluble maleimide-based copolymer formed may become to low. A more preferred amount is 50 to 200% by mass.

One or more of the known radical polymerization initiators, peroxides and azo initiators can be used as the above-mentioned radical polymerization initiator. The polymerization initiator is preferably used in an amount of 0.001 to 5.0% by mass, more preferably 0.5 to 3.0% by mass, relative to 100% by mass of the sum of the monomer composition. One or more of α-methylstyrene dimer and mercaptan type chain transfer agents can be used as the molecular weight modifier. Among them, long-chain alkylmercaptans containing not less than 8 carbon atoms are preferred from the faint odor and weak tendency toward discoloration viewpoint.

The polymerization temperature in the above copolymerization is to be appropriately selected according to the radical polymerization initiator employed, among others. Generally, however, the range of 50 to 200° C. is preferred. At below 50° C., the use of an initiator showing a low decomposition temperature is required, hence equipment for storing the initiator under cooling becomes necessary; this is industrially disadvantageous. At above 200° C., the monomer composition may begin to polymerize thermally before the temperature arrives at the decomposition point of the initiator. The range of 80 to 150° C. is more preferred.

In cases where the alkali-soluble maleimide-based copolymer is produced by the above-described method of production, the alkali-soluble maleimide-based copolymer may be used by isolating from the reaction mixture by removing the volatile matter after completion of the polymerization reaction, or the copolymer may be used in the solution form without recovering the solid matter. For isolating the alkali-soluble maleimide-based copolymer, the method comprising heating the reaction mixture under vacuum or the method comprising pouring the reaction mixture into a poor solvent and collecting the precipitate by filtration, for instance, can be applied.

The content of the unreacted N-cyclohexylmaleimide monomer, N-benzylmaleimide monomer and substituted N-benzylmaleimide monomer, namely the total residual amount of these monomers, in the alkali-soluble maleimide-based copolymer of the present invention is preferably not more than 3% by mass relative to 100% by mass of the alkali-soluble maleimide-based copolymer. When the content is over 3% by mass, the heat stability tends to be low and/or discoloration may take place. Further, the N-cyclohexylmaleimide monomer, N-benzylmaleimide monomer and substituted N-benzylmaleimide monomer are undesirably highly toxic. Their residual content is more preferably not more than 1% by mass, most preferably not more than 0.5% by mass.

As for the residual contents of the monomers other than the N-cyclohexylmaleimide monomer, N-benzylmaleimide monomer and substituted N-benzylmaleimide monomer in the alkali-soluble maleimide-based copolymer of the present invention, the sum of them is preferably not more than 5% by mass, relative to 100% by mass of the alkali-soluble maleimide-based copolymer. An amount of the residual monomers exceeding 5% by mass may decrease the heat stability or cause discoloration. The residual contents of the monomers is more preferably not more than 3% by mass, most preferably not more than 1% by mass.

As for the molecular weight, the alkali-soluble maleimide-based copolymer of the present invention preferably has a weight average molecular weight of 5,000 to 50,000. When it is lower than 5,000, the heat resistance and thermal stability may be low and, when it exceeds 50,000, the solubility in alkali water may become low. The molecular weight of the alkali-soluble maleimide-based copolymer is more preferably 5,000 to 35,000, still more preferably 7,000 to 32,000.

As for the solubility in alkali water, the alkali-soluble maleimide-based copolymer of the present invention is preferably soluble in a 1% aqueous solution of KOH, for instance. In this case, it is desirable that addition of the copolymer in an amount of 20% by mass to a 1% aqueous solution of KOH, followed by 3 hours of stirring result in complete dissolution. With an ionizing radiation-curable resin composition containing such alkali-soluble maleimide-based copolymer, it becomes possible to form sharp patterns as a result of dissolution of the uncured portion in alkali water.

The alkali-soluble maleimide-based copolymer of the present invention preferably has an acid value of 50 to 300 mg KOH/g. When the acid value is less than 50 mg KOH/g, the solubility in alkali water may be low and, when it exceeds 300 mg KOH/g, the alkali-soluble maleimide-based copolymer may become brittle. The acid value of the alkali-soluble maleimide-based copolymer is more preferably 60 to 200 mg KOH/g.

When the alkali-soluble maleimide-based copolymer of the present invention is provided with ionizing radiation curability in the above-mentioned process of production, in particular when the alkali-soluble maleimide-based copolymer of the present invention contains a copolymerizable double bond-containing monomer unit as a constituent element, it is judicious to produce the same by preparing a carboxyl group-containing copolymer through copolymerization using an unsaturated carboxylic acid and then reacting the copolymer with a compound having a functional group capable of bonding to the carboxyl group and a copolymerizable double bond.

In the above case, (meth)acrylic acid is preferably used as the unsaturated carboxylic acid. Usable as the compound having a functional group capable of bonding to the carboxyl group and a copolymerizable double bond are compounds having an oxirane ring and a copolymerizable double bond, such as glycidyl (meth)acrylate and allyl glycidyl ether; unsaturated alcohols such as allyl alcohol; 2-hydroxyethyl (meth)acrylate; N-methylolacrylamide; 2-acryloyloxyethyl isocyanate, 2-methacryloyloxyethyl isocyanate, and the like. Among them, compounds having an oxirane ring and a copolymerizable double bond are preferably used. The use of glycidyl (meth)acrylate is more preferred. The amount of such compound is to be appropriately selected so that the double bond equivalent of the alkali-soluble maleimide-based copolymer may fall within the above-mentioned range.

As a preferred method of adding glycidyl (meth)acrylate to the above carboxyl group, there may be mentioned the method comprising carrying out the reaction in a temperature range of 90 to 120° C. in the presence of a catalyst and a polymerization inhibitor for 2 to 24 hours. Suited for use as the catalyst are tertiary amines such as triethylamine and dimethylbenzylamine; quaternary ammonium salts such as tetrabutylammonium bromide; phosphines such as triphenylphosphine; phosphonium salts such as tetraphenylphosphonium bromide; lithium chloride; and metal salts such as zinc octylate. Among them, tertiary amines are most preferred from the reactivity viewpoint. In a temperature range below 90° C., the addition reaction rate is very slow at an economic disadvantage. At temperatures above 120° C., crosslinking due to thermal polymerization will occur and the molecular weight may become excessively high or gelation may occur undesirably.

The alkali-soluble maleimide-based copolymer of the present invention is also excellent in pigment dispersing ability. Thus, a pigment dispersion composition excellent in pigment dispersibility can be prepared by compounding the alkali-soluble maleimide-based copolymer with a pigment in a solvent, if necessary supplemented with a dispersant. Such pigment dispersion composition constitutes a preferred embodiment of the present invention.

As the pigment mentioned above, use can be made of one or more of various organic or inorganic colorants.

Usable as the organic colorants are dyes, organic pigments, and natural coloring materials, among others.

Suited for use as the organic pigments are those compounds classified as pigments in the Colour Index (C.I.: published by The Society of Dyers and Colourists), namely compounds having the following Colour Index (C.I.) numbers.

Yellow pigments such as C.I. Pigment Yellow 139, C.I. Pigment Yellow 138, C.I. Pigment Yellow 50, C.I. Pigment Yellow 180, and C.I. Pigment Yellow 185; red pigments such as C.I. Pigment Red 254 and C.I. Pigment Red 177; blue pigments such as C.I. Pigment Blue 15, C.I. Pigment Blue 15:3, C.I. Pigment Blue 15:4, and C.I. Pigment Blue 15:6; violet pigments such as C.I. Pigment Violet 23:19; and green pigments such as C.I. Pigment Green 7 and C.I. Pigment Green 36.

Suited for use as the above-mentioned inorganic colorant are inorganic pigments and extender pigments, including titanium oxide, barium sulfate, lead sulfate, zinc yellow, red oxide (red iron(III) oxide), ultramarine, iron blue, cobalt green, titanium black, carbon black and the like.

Among the pigments mentioned above, phthalocyanine pigments, in particular blue phthalocyanine pigments, such as copper phthalocyanine, are preferred because of their good affinity for the alkali-soluble maleimide-based copolymer. Since the alkali-soluble maleimide-based copolymer is excellent in color characteristics, such as transparency and resistance for yellowing, the combined use thereof with blue pigments, which are significantly affected in color tone by yellowing, is very effective, hence preferred.

The present invention is also directed to a pigment dispersion composition which comprises at least one or more pigments selected from the group consisting of blue pigments and phthalocyanine pigments, the above alkali-soluble maleimide-based copolymer, a dispersant and a solvent.

The pigment, alkali-soluble maleimide-based copolymer, dispersant and solvent in the above pigment dispersion composition each may comprise one or more species. Further, among the blue pigments, blue phthalocyanine pigments are particularly preferred.

As for the content of the alkali-soluble maleimide-based copolymer in the above pigment dispersion composition, the alkali-soluble maleimide-based copolymer preferably amounts to 70 to 110 parts by mass per 100 parts by mass of the total amount of pigments including at least one pigment selected from the group consisting of blue pigments and phthalocyanine pigments, namely the total amount of pigments in the pigment composition. Good pigment dispersibility can thus be attained. The content of 80 to 100 parts by mass is more preferred.

In the pigment dispersion composition, it is preferred that the mixing ratio of the dispersant to the sum of pigments including the pigment selected from the group consisting of blue pigments and phthalocyanine pigments (dispersant/pigment ratio) is not more than 0.5 by mass. More preferably, it is not more than 0.3 by mass. Although a smaller dispersant amount is more preferred, a dispersant-to-pigment ratio of not less than 0.05 is generally preferred for effectively producing the dispersing action of the dispersant.

Usable as the dispersant are cationic, anionic, nonionic, amphoteric, silicone, and fluorine-containing surfactants. Among them, polymer surfactants (polymer dispersants) are preferably used, however. Suited for use as the polymer surfactants are polyoxyethylene alkyl ethers such as polyoxyethylene lauryl ether, polyoxyethylene stearyl ether, and polyoxyethylene oleyl ether; polyoxyethylene alkylphenyl ethers such as polyoxyethylene octylphenyl ether and polyoxyethylene nonylphenyl ether; polyethylene glycol diesters such as polyethylene glycol dilaurate and polyethylene glycol distearate; sorbitan fatty acid esters; fatty acid-modified polyesters; and tertiary amine-modified polyurethanes.

Organic solvents are judiciously used as the solvent (dispersing solvent) to be used in preparing the above pigment dispersion composition. Usable as the organic solvents are those organic solvents to be used as the diluent in preparing the ionizing radiation-curable resin composition, which is to be mentioned later herein. The solvent amount is preferably 100 to 1,000 parts by mass, more preferably 200 to 900 parts by mass, relative to 100 parts by mass of the pigment.

The above pigment dispersion composition can be prepared according to the conventional procedure for preparing known pigment dispersion compositions by replacing part of the dispersant used therein with the above alkali-soluble maleimide-based copolymer. Thus, at least one or more pigments selected from the group consisting of blue pigments and phthalocyanine pigments, the alkali-soluble maleimide-based copolymer, a dispersant, and other ingredient employed according to need are mixed with a solvent in an arbitrary order and dispersed therein using a dispersion mixer known in the art, for example a kneader, roll mill, Dissolver, or sand mill. Specifically, the method comprising adding a mixture of an organic pigment and a binder to a solvent and dispersing the mixture therein, the method comprising adding a pigment and a binder respectively to a solvent and dispersing them therein; and the method comprising mixing a dispersion of a pigment alone in a solvent with a dispersion of a binder alone in a solvent are suited for use.

The above pigment dispersion composition is suitable as a premix for the preparation of a coating composition such as an ionizing radiation-curable resin composition excellent in pigment dispersibility. Coating compositions excellent in pigment dispersibility can be prepared with ease by adding an additional binder portion and/or another or other component or components to the above pigment dispersion composition, or by adding the above pigment dispersion composition, an additional binder portion and another or other component or components to a solvent (solvent for dilution) for adjusting the solid concentration.

The present invention is also concerned with an ionizing radiation-curable resin composition which comprises the above alkali-soluble maleimide-based copolymer, a radical-polymerizable compound and a photopolymerization initiator. The alkali-soluble maleimide-based copolymer, radical-polymerizable compound and photopolymerization initiator to be used each may comprise one single species or a combination of two or more species.

The ionizing radiation-curable resin composition of the present invention, when applied onto a color filter substrate and exposed to light, can give a cured film excellent in adherence to the surface of the target of coating (substrate surface), film strength, heat resistance, resistance for warm pure water, chemical resistance and other physical properties owing to the excellent physical properties and alkali developability of the alkali-soluble maleimide-based copolymer and to the three-dimensional network structure formed by the radical-polymerizable compound and, when developed by exposing to light through a predetermined pattern, can form an accurate pattern.

The above alkali-soluble maleimide-based copolymer is preferably incorporated in an amount of 5 to 80% by mass, per 100% by mass of the ionizing radiation-curable resin composition. At an addition level below 5% by mass, the viscosity becomes excessively low and the film stability after application and drying may become insufficient and, at levels exceeding 80% by mass, the viscosity becomes too high, the flowability decreases, possibly causing such a trouble as deteriorated applicability. The amount of the alkali-soluble maleimide-based copolymer incorporated in the ionizing radiation-curable resin composition is more preferably 10 to 50% by mass.

The above radical-polymerizable compound may be any of those compounds capable of forming a crosslinking bond under the action of ionizing radiation and causing curing of the ionizing radiation-curable resin composition. However, a photopolymerizable compound having three or more ethylenically unsaturated double bonds per molecule (at least trifunctional photopolymerizable compound) is preferably used and, further, bifunctional photopolymerizable compounds or the like can also be used. Usable as the at least trifunctional photopolymerizable compound are poly(meth)acrylates of at least trihydric polyhydric alcohols or dicarboxylic acid modifications thereof, among others. Specifically suited for use are trimethylolpropane tri(meth)acrylate, pentaerythritol tri(meth)acrylate, succinic acid-modified pentaerythritol tri(meth)acrylate, pentaerythritol tetra(meth)acrylate, and dipentaerythritol hexa(meth)acrylate. Among them, dipentaerythritol pentaacrylate and dipentaerythritol hexa(meth)acrylate are preferably used. The term "(meth)acrylate" means that either an acrylate or a methacrylate can be used.

The above radical-polymerizable compound is preferably used in an amount of 5 to 70% by mass, per 100% by mass of the ionizing radiation-curable resin composition. When the amount is less than 5% by mass, the removability of unexposed parts in the step of development may worsen and, when it is above 70% by mass, the viscosity becomes too low and the film stability after application and drying becomes insufficient, hence troubles such as impairing qualities for exposure and development may be caused. The above radical-polymerizable compound is more preferably used in amount of 10 to 40% by mass.

In the ionizing radiation-curable resin composition of the present invention, there may be incorporated, together with the above radical-polymerizable compound, one or more monofunctional photopolymerizable monomers and the like as reaction diluents. Suited for use as such compounds are methyl (meth)acrylate, ethyl (meth)acrylate and propyl (meth)acrylate.

The above photopolymerization initiator may be any of those compounds which generate active species, such as radicals, cations or anions upon exposure to ionizing radiation at wavelengths not longer than 365 nm, and can initiate the polymerization of the above radical-polymerizable compound but preferably is one highly soluble in the solvent contained in the ionizing radiation-curable resin composition. Usable as such photoinitiator are, among others, compounds capable of generating free radicals under the action of ultraviolet radiation energy, including, as suitable species, benzoin, benzophenone and benzophenone derivatives, or esters and other derivatives thereof; xanthone and thioxanthone derivatives; halogen-containing compounds such as chlorosulfonyl-, chloromethyl-polynuclear aromatic compounds, chloromethyl-heterocyclic compounds, and chloromethylbenzophenones; triazines; imidazolines; fluorenones; haloalkanes; photoreducible dye-reducing agent redox couples; organosulfur compounds; and peroxides. Among them, triazines and imidazolines are preferably used.

The level of addition of the above photopolymerization initiator is preferably 0.05 to 20% by mass, per 100% by mass of the ionizing radiation-curable resin composition. At levels below 0.05% by mass, the curability of the films formed from the ionizing radiation-curable resin composition may be insufficient and, at levels exceeding 20% by weight, the removability of unexposed parts in the step of development may decrease or such a trouble as film yellowing may occur after postbaking. The level of addition of the above photopolymerization initiator is more preferably 2 to 15% by mass.

The ionizing radiation-curable resin composition of the present invention may further contain one or more ingredients, when necessary, in addition to the above-mentioned essential components and, preferably, it contains a sensitizer; a colorant; a thermosetting resin capable of curing by reacting with an acid upon heating; and/or the like.

When it contains a sensitizer, the ionizing radiation-curable resin composition can show improved sensitivity. Preferably used as such sensitizer is a styryl compound or a coumarin compound. The styryl compound includes one or more of 2-(p-dimethylaminostyryl)quinoline, 2-(p-diethylaminostyryl)quinoline, 4-(p-dimethylaminostyryl)quinoline and the like, and the coumarin compound includes one or more of 7-diethylamino-4-methylcoumarin, 7-ethylamino-4-trifluoromethylcoumarin, 4,6-diethylamino-7-ethylaminocoumarin and the like.

The level of addition of the above-described sensitizer is preferably 0.1 to 50% by mass per 100% by mass of the ionizing radiation-curable resin composition.

When it contains such a colorant as mentioned above, the ionizing radiation-curable resin composition can form colored cured films such as the colored layer of color filters. The ionizing radiation-curable resin composition capable of forming such colored films is referred to herein also as ionizing radiation-curable colored resin composition. Since the above alkali-soluble maleimide-based copolymer can exhibit good pigment dispersing ability, it can reduce the dispersant addition level in such ionizing radiation-curable colored resin composition and thereby improve the physical properties of the films formed from the ionizing radiation-curable colored resin composition and, thereby, it becomes possible to form colored films excellent in physical properties, such as hardness and elasticity, after curing.

As the above colorant, there may be mentioned one or more of pigments, dyes and the like, and the colorant to be used can be selected, according to the desired color, for example R, G, B or the like of pixels, from among the above-described organic colorants and inorganic colorants which are sufficiently resistant to heat to endure the color filter heating process and occur as readily dispersible fine particles. Among the colorants, phthalocyanine pigments are preferred since they are excellent in affinity for the alkali-soluble maleimide-based copolymer, as mentioned hereinabove. Further, the combination of the alkali-soluble maleimide-based copolymer with blue pigments is very effective, hence preferred. The ionizing radiation-curable resin composition (ionizing radiation-curable colored resin composition) which comprises at least one or more pigments selected from the group consisting of blue pigments and phthalocyanine pigments constitutes one of the preferred embodiments of the present invention.

The level of addition of the above colorant is preferably 40 to 75% by mass, per the solid matter of 100% by mass in the ionizing radiation-curable resin composition. At levels lower than 40% by mass, the coloring power of each colored layer becomes insufficient, hence sharp image displaying may become difficult. At levels exceeding 75% by mass, the light transmittance of each colored layer may become insufficient or other troubles may occur. The level of addition of the above colorant is more preferably 45 to 70% by mass.

When the ionizing radiation-curable resin composition contains the above colorant, one or more dispersants may be incorporated therein for attaining uniform and stable dispersion of the colorant. Such dispersants and the level of addition may be the same as those mentioned above referring to the pigment dispersion composition.

When the ionizing radiation-curable resin composition, which contains the above-mentioned thermosetting resin capable of curing by reacting with an acid upon heating, is applied to the substrate surface and exposed to light and developed to give a desired pattern and the thus-formed cured pattern is heated to an appropriate temperature, the thermosetting resin reacts with and consumes the carboxyl group remaining in the cured pattern, whereby the alkali resistance is improved and, at the same time, the physical properties of the cured pattern are improved owing to the crosslinking reaction of the thermosetting resin. As a result, the heat resistance, adherence, resistance for warm pure water and chemical resistance (in particular alkali resistance) of the film or pattern formed from the ionizing radiation-curable resin composition of the present invention are improved.

Preferred as the acid-reactive thermosetting resin are epoxy resins, in particular epoxy resins having tow or more epoxy groups per molecule. Thus, one or more of bisphenol A-type epoxy resins, bisphenol F-type epoxy resins, phenol novolak type epoxy resins, cresol novolak type epoxy resins, alicyclic epoxy resins and the like are suited for use.

The level of addition of the above thermosetting resin is preferably 1 to 20% by mass, per 100% by mass of the ionizing radiation-curable resin composition. At levels below 1% by mass, the film formed upon curing of the ionizing radiation-curable resin composition may not be provided with sufficient alkali resistance and, at levels exceeding 20% by mass, troubles may occur, for example the storage stability and developability of the ionizing radiation-curable resin composition may decrease. The level of addition of the above thermosetting resin is more preferably 3 to 15% by mass, In the ionizing radiation-curable resin composition of the present invention, there may be incorporated, where necessary, one or more of various additives other than the components described above. As such additives, there may be mentioned silane coupling agents, such as vinylsilanes, acrylsilanes and epoxysilanes. By adding such additives, it is possible to improve the adherence to the substrate and/or the neighboring coat film layer.

As for the method of production, the ionizing radiation-curable resin composition of the present invention can be produced, for example, by mixing up the alkali-soluble maleimide-based copolymer, radical-polymerizable compound and photopolymerization initiator and optional components other than the above-described essential components, or adding them to a solvent, and stirring the resulting mixture for uniform dissolution or dispersion. In such production process, the order of mixing or adding is not particularly restricted. Suited for use as the stirring apparatus are Dissolver and Homomixer.

Considering the use as a coating composition and the applicability thereof, the ionizing radiation-curable resin composition of the present invention is generally used in a form diluted with a solvent. Preferably used as such solvent are those solvents capable of dissolving the alkali-soluble maleimide-based copolymer, radical-polymerizable compound and photopolymerization initiator and having a high boiling point and suited for use in spin coating. As example, there may mentioned alcohol solvents such as n-propyl alcohol and isopropyl alcohol; cellosolve type solvents such as methoxy alcohols and ethoxy alcohols; carbitol solvents such as methoxyethoxyethanol and ethoxyethoxyethnaol; ester solvents such as methyl methoxypropionate, ethyl ethoxypropionate, and ethyl lactate; ketone solvents such as methyl isobutyl ketone and cyclohexanone; cellosolve acetate solvents such as methoxyethyl acetate, ethoxyethyl acetate, and ethylcellosolve acetate; carbitol acetate solvents such as methoxyethoxyethyl acetate and ethoxyethoxyethyl acetate; ether solvents such as diethyl ether, ethylene glycol dimethyl ether, diethylene glycol dimethyl ether, and tetrahydrofuran; aprotic amide solvents such as N,N-dimethylacetamide and N-methylpyrrolidone; lactone solvents such γ-butyrolactone; unsaturated hydrocarbon solvents such as xylene and naphthalene; saturated hydrocarbon solvents such as n-heptane, n-hexane, and n-octane; and like organic solvent. Either one or two or more of them can be used. Among these, 3-methoxybutyl acetate, propylene glycol monomethyl ether acetate, diethylene glycol dimethyl ether and the like are preferably used. The amount of the solvent may appropriately be adjusted according to the state of dissolution of the components compounded and the applicability but is preferably adjusted so that the solid matter concentration may amount to 5 to 50% by mass.

An example of the method of forming cured films (inclusive of cured films having a predetermined pattern) using the ionizing radiation-curable resin composition of the present invention is described in the following.

First, the ionizing radiation-curable resin composition of the present invention is applied to the surface of a body to be coated, such as a substrate, the thus-formed coat film is exposed to light by irradiating with such ionizing radiation as ultraviolet rays or electron beams, to thereby cause curing. Upon exposure of the coat film to ionizing radiation, an active species is formed from the photopolymerization initiator by the action of ionizing radiation in the coat film and this active species initiates the crosslinking reaction of the radical-polymerizable compound, whereby the coat film is cured.

When it is desired, on that occasion, that the coat film be formed according to a predetermine pattern such as a pixel pattern or pillar-like spacer pattern, the film is exposed to light according to the predetermined pattern, for example through a photomask, followed by development. Since the alkali-soluble maleimide-based copolymer in the film has carboxyl groups, unexposed portions of the film where the radical-polymerizable compound has not yet formed any crosslinking bonds can be removed by alkali development, whereby a coat film having the predetermined pattern can be formed.

The above coat film is exposed to light for curing and, after development according to need, further cured by heating, whereby a cured film is obtained. When ethylenic double bonds due to the radical-polymerizable compound remain in the coat film, the crosslinking reaction thereof can further be allowed to proceed in a heating step. When a thermosetting resin, such as a polyfunctional epoxy resin, is contained in the coat film, it reacts with and consumes the carboxyl groups which the alkali-soluble maleimide-based copolymer remaining in the coat film has and at the same time forms crosslinking bonds. As a result, the heat resistance, adherence, resistance for warm pure water and chemical resistance (in particular alkali resistance) of the cured film are further improved.

The ionizing radiation-curable resin composition of the present invention can give a cured film excellent in various physical properties such as the adherence to coated surface, film strength, heat resistance, resistance for warm pure water, and chemical resistance and, it can give an accurate pattern by alkali development. Furthermore, it is excellent in transparency and heat stability for color tone and, in particular, will never yellow even upon exposure to a high-temperature environment in the heating step of alignment film formation, among others, in the process of color filter production, hence it can form a highly transparent protective layer and a colored layer having a desired color tone. Thus, an preferred embodiment of the ionizing radiation-curable resin composition of the present invention is such that when the ionizing radiation-curable resin composition is applied to a glass substrate by spin coating, exposed to light at a dose of 100 mJ/cm$^2$ and heated at 200° C. for 30 minutes to give a 5-μm-thick film and the film is further heated at 250° C. for 1 hour, the coat film thus formed can retain at least 90% of the light transmittance at 380 nm. Such a mode of embodiment can be attained in accordance with the present invention.

In a preferred embodiment of the present invention, the above ionizing radiation-curable resin composition when exposed, in the form a 1.0-μm-thick cured film, to ultraviolet rays from an ultrahigh pressure mercury lamp and further heated at 250° C. for 1 hour, shows a color difference (ΔEab) of not more than 2.0 after the above series of treatments. In other words, when a 1.0-μm cured coat film formed from the ionizing radiation-curable resin composition is irradiated with ultraviolet rays from an ultrahigh pressure mercury lamp and heated at 250° C. for 1 hour, the color difference (ΔEab) between the film before ultraviolet irradiation and the film after heating is not more than 2.0. Such ionizing radiation-curable resin composition is excellent in transparency and heat stability for color tone, hence is suited for use as a material for transparent protective layer formation. A color filter which comprises a transparent protective layer formed by curing the above ionizing radiation-curable resin composition constitutes another aspect of the present invention. In a more preferred embodiment, the color difference (ΔEab) is not more than 1.0.

The color difference (ΔEab) is a value calculated using the color difference equation given below for the CIE 1976 (L*, a*, b*) space colorimetric system (The Color Science Association of Japan (ed.): Shikisai Kagaku Handobukku (Color Science Handbook), New Edition (1985), page 266).

$$\Delta Eab = \{(\Delta L)^2 + (\Delta a)^2 + (\Delta b)^2\}^{1/2}$$

The coat film made of the ionizing radiation-curable resin composition of the present invention has transparency, heat stability for color tone and, in addition, sufficient hardness. Thus, a preferred mode of embodiment of the present invention is that the above ionizing radiation-curable resin composition which, in the form of a 5-μm-thick cured film formed on a transparent substrate, shows, at 180° C., a universal hardness of not less than 200 N/mm$^2$ and an elastic deformation modulus of not less than 30%. More specifically, when the above ionizing radiation-curable resin composition is applied onto a glass substrate by spin coating, exposed to light at a dose of 100 mJ/cm$^2$ and heated at 200° C. for 30 minutes to give a 5-μm-thick coat film, the universal hardness of that film as measured at a surface temperature of 180° C. under conditions such that the maximum load of a Vickers indenter amounts to 20 mN (test load/Vickers indenter surface area under test load) is not less than 200 N/mm$^2$ in the above mode of embodiment, and such mode can be attained in accordance with the present invention. The universal hardness is described in Zairyo Shiken Gijutu (Material Testing Technology), vol. 43, No. 2 (April, 1998), page 72 and can be evaluated according to the German standard DIN 50359-1. Such ionizing radiation-curable resin composition is suited for use as a material for forming pillar-like spacers to be included in color filters, and such a color filter which comprises pillar-like spacers formed by curing the above ionizing radiation-curable resin composition constitutes a further aspect of the present invention.

The above-mentioned ionizing radiation-curable resin composition containing at least one or more pigments selected from the group consisting blue pigments and phthalocyanine pigments (ionizing radiation-curable colored resin composition) can form blue colored coat films or phthalocyanine pigment-containing colored coat films in a variety of fields. Such ionizing radiation-curable resin composition is very suited for forming color filter-constituting blue pixels or phthalocyanine pigment-containing pixel patterns, preferably blue phthalocyanine pigment-containing blue pixel patterns, in particular, and can give high-performance, high-quality color filers. The formation of colored layers (pixel patterns), in particular blue pixel patterns, of color filters using such ionizing radiation-curable resin composition is a preferred mode of practice of the present invention.

As for the color characteristics, the above ionizing radiation-curable resin composition, particularly when used for forming blue cured films, can form highly transparent pixels. In such a preferred mode of embodiment, the above ionizing radiation-curable resin composition can form a cured film having a thickness of 1.35 μm after curing and capable of displaying a color space whose x coordinate covers the range of $0.05 \leq x \leq 0.30$, whose y coordinate covers the range of $0.05 \leq y \leq 0.30$ and whose stimulus value Y is not less than 20 in a C light source colorimetric XYZ color system determined under 2-degree visual field. More specifically, when the above ionizing radiation-curable resin composition is applied onto a glass substrate by spin coating, dried at 80° C. for 3 minutes, exposed to light at a dose of 100 mJ/cm$^2$ and then heated at 230° C. for 30 minutes to give a blue cured film, the thus-formed blue cured film having a thickness of not more than 1.35 μm, when subjected to colorimetry as a single pixel, is in a position to display a color space whose x coordinate covers the range of $0.05 \leq x \leq 0.30$, whose y coordinate covers the range of $0.05 \leq y \leq 0.30$ and whose stimulus value Y is not less than 20 in a C light source colorimetric XYZ color system determined under 2-degree visual field. More preferably, the ionizing radiation-curable resin composition forms a cured film capable of displaying a color space whose stimulus value Y is not less than 21.0.

Further, the above ionizing radiation-curable resin composition, in which the highly heat-resistant alkali-soluble maleimide-based copolymer is used, hardly undergoes yellowing and can form a blue cured film having high color tone heat resistance. In a preferred mode of embodiment, the above ionizing radiation-curable resin composition can form a cured film which, when measured, at a thickness of 1.3 μm after curing, for stimulus value Y at y=0.1400 in a C light source colorimetric XYZ color system determined under 2-degree visual field before and after 1 hour of heating at 250° C., gives a ratio of the measured value Y2 after heating to the measured value Y1 before heating, (Y2/Y1)×100, of not less than 97%. More specifically, when the above ionizing radiation-curable resin composition is applied onto a glass substrate by spin coating, dried at 80° C. for 3 minutes, exposed to light at a dose of 100 mJ/cm$^2$ and then heated at 230° C. for 30 minutes to give a blue cured film having a thickness of about 1.3 μm and then this blue cured film is subjected to heat resistance testing at 250° C. for 1 hour in anticipation of the heating step for the formation of an electrode by sputtering and formation of an alignment layer, such as a polyimide alignment layer, onto color filter, the film, when measured for stimulus value Y at y=0.1400 in a C light source colorimetric XYZ color system determined under 2-degree visual field before and after heat resistance testing, can retain a ratio of the measured value Y2 after testing to the measured value Y1 before testing {(Y2/Y1)× 100} of not less than 97%.

As for fine pattern-forming performance characteristics such as photoengraving characteristics and developability, the above ionizing radiation-curable resin composition is excellent in various points, for example in mode of development, development time, residue, surface roughening (smoothness), adherence, dissolution, cross-section (sectional profile), and contrast. In a preferred embodiment, the above ionizing radiation-curable resin composition can form a cured film with a contrast ratio of not less than 2,000. It is also desirable that the above ionizing radiation-curable resin composition forms a cured film whose surface roughness (Ra) is not more than 50 Å as determined by the measurement method according to JIS B 0601-1994.

In the step of development of a negative photoresist, unexposed and uncured portions of the resist layer are dissolved and removed from the substrate by an alkali developer, and there are two types of development; one is the peeling type according to which the leaving portions are mostly peeled off in large lumps, and the other is the dissolution type involving gradual dissolution and dispersion, like a dye dissolving in water. The former peeling type is an unfavorable mode of development, since solid matter lumps may remain in the system as foreign matters, readily staining pixels of other colors. On the contrary, the ionizing radiation-curable resin composition of the present invention is developed according to the latter dissolution type, hence in a preferred mode of development.

In the step of development of a negative photoresist, unexposed and uncured portions of the resist layer are dissolved and removed from the substrate by an alkali developer. However, in some instances, the uncured resist is not wholly removed but some residues may remain on the substrate. When another color resist is applied and developed for pixel formation at places where such development residues remain, the residues exert unfavorable influences, for example the color characteristics fluctuate and/or the smoothness decreases. On the contrary, the ionizing radiation-curable resin composition of the present invention will not leave any residue on the sites of dissolution in the step of development, so that the quality of other pixels than blue ones can also be improved. For reducing the amount of residues, the solubility of the resist generally increases to an excessive level, so that such problems as surface roughening, decreased adherence and decreased dissolution arise and the pattern accuracy is impaired. On the contrary, a cured film produced using the ionizing radiation-curable resin composition of the present invention gives an accurate pattern as desired without leaving residues at places from which such residues are to be removed upon development.

The above ionizing radiation-curable resin composition forms a cured film showing a tapered cross-section. Generally, when a colored resist is applied onto a substrate and the coat film is developed, the colored layer obtained may have a tapered (trapezoidal) cross-section the lower base (in contact with the substrate) of which is longer than the upper base (opposing to the face in contact with the substrate) (namely (upper face/lower face)<1), a rectangular cross-section (namely (upper face/lower face)=1), or a reverse tapered (reverse trapezoidal) cross-section the lower base of which is shorter than the upper base (namely (upper face/lower face)>1). When the colored layer has a reverse tapered cross-section, problems are encountered in the step of vapor deposition of an ITO electrode layer on the colored layer: for example, ITO cannot go around to the sides of a colored layer thoroughly successfully and portions lacking the ITO layer thus remain in the vicinity of the lower base, hence no electric connection can occur or the resistance value increases locally. Such problems arise when a pixel pattern of color filter is formed using a colored resist. Further, the corners of a colored layer having a reverse tapered section are broken off during various processes and the fragments adhere to other parts of the color filter and thus cause lacking in protrusions. Therefore, the colored layer formed by applying a resist onto a substrate, followed by development and postbaking is desired to have a tapered (trapezoidal) cross-section. The use of the ionizing radiation-curable resin composition of the present invention to meet such demand leads to formation of a blue layer pattern having a tapered cross-section (approximately trapezoidal, (upper face/lower face)<1), hence to coating with deficiency-free ITO electrodes and to prevention of the lack of protrusions. Thus, in a preferred mode of embodiment of the present invention, the above ionizing radiation-curable resin composition can form a cured film with a cross-sectional rising angle of not more than 90° relative to the coated surface, or with a cross-section having a ratio of upper base to lower base of less than 1. In a more preferred mode, the cured film has a cross-sectional rising angle of not more than 50° relative to the coated surface.

The ionizing radiation-curable resin composition (ionizing radiation-curable colored resin composition), when in the above preferred mode, is suited for use as a material for forming color filter-constituting colored layers.

A color filter which comprises a colored layer formed by curing the above ionizing radiation-curable resin composition also constitutes an aspect of the present invention.

The ionizing radiation-curable resin composition of the present invention is excellent not only in various physical properties required of an ionizing radiation-curable resin composition, such as alkali developability, but also in transparency and heat stability for color tone. A color filter in which at least one of the colored layer, protective layer and spacer is formed from such ionizing radiation-curable resin composition, or a liquid crystal display comprising such color filter is excellent in pixel transparency and pattern accuracy, hence is of high performance and high quality.

The present invention further provides a color filter which comprises a transparent substrate and a colored layer formed on said transparent substrate as essential constituents, optionally further comprises a protective layer covering said colored layer and/or a spacer disposed at sites overlapping with non-displaying sites on said transparent substrate for maintaining the distance to the opposing electrode substrate wherein at least one of the colored layer, protective layer and spacer is formed by curing the above ionizing radiation-curable resin composition.

The constitution of the above color filter may be the one comprising the transparent substrate provided with (1) the colored layer, (2) the colored layer and protective layer, (3) the colored layer and spacers, or (4) the colored layer, protective layer and spacers, on the transparent substrate. It is preferred, for example, that a part of the colored layer is formed according to a predetermined pattern on the black matrix layer formed in a predetermined pattern on the transparent substrate. On the protective layer, there may be formed transparent electrodes for liquid crystal driving, as necessary. The black matrix can be formed by the pigment dispersion method or printing method. It may also be formed by the chromium sputtering method.

In the above colored layer, a red pattern, a green pattern and a blue pattern are generally disposed in a desired mode, for example in a mosaic, stripe, triangle, 4-pixel arrangement, or island manner arranged in doglegged form, and the black matrix covers the gaps of the colored pattern and a predetermined region outside the colored layer formation region. Such colored layer is preferably formed by the pigment dispersion method using the ionizing radiation-curable resin composition.

In colored layer formation by the pigment dispersion method, the colored layer can be formed by preparing a coating material by dispersing the color pigment in the ionizing radiation-curable resin composition, applying the coating material to one side of the transparent substrate, exposing the material to light by irradiating with ionizing radiation, such as ultraviolet rays, through a photomask and, after alkali development, heating the pattern for curing in a clean oven or the like. Generally, the thickness of the colored layer is preferably about 1.5 μm.

The protective layer mentioned above can be formed by applying a coating composition prepared from the ionizing radiation-curable resin composition using a spin coater or die coater, or by printing, for instance. When a spin coater is used, the number of revolutions is preferably selected at a level of 500 to 1,500 revolutions/minute. The coat film of the ionizing radiation-curable resin composition is exposed to light by irradiation with ionizing radiation through a photomask and, after alkali development, heated for curing in a clean oven or the like to give a protective layer. Generally, the thickness of the protective layer is preferably about 2 μm.

When transparent electrodes are formed on the above protective layer, the transparent electrodes are generally formed by such a conventional method as sputtering, vacuum deposition or CVD (chemical vapor deposition) using indium tin oxide (ITO), zinc oxide (ZnO), or tin oxide (SnO), or an alloy thereof and, where necessary, given a desired pattern by etching using a photoresist or by using a tool. The transparent electrodes preferably have a thickness of about 20 to 500 nm, more preferably about 100 to 300 nm.

The spacers mentioned above are preferably pillar-like spacers having a height corresponding to the cell gap. The sites of forming such spacers are preferably on the transparent electrode plate, colored layer or protective layer, conforming to the region where the black matrix layer has been formed. The spacers can be formed on the transparent electrodes or elsewhere by applying a coating composition comprising the ionizing radiation-curable resin composition of the present invention by using a spin coater or die coater or by printing, for instance, exposing the coat film to light by ionizing radiation irradiation through a photomask and, after alkali development, heating the pattern for curing in a clean oven or the like. Like in the case of protective layer formation, the speed of the spin coater may be adjusted to 500 to 1,500 revolutions/minute. The thickness (height) of the pillar-like spacers is preferably about 5 μm.

The color filter of the present invention in which at least one of the above color layer, protective layer, and pillar-like spacer is formed by curing the above ionizing radiation-curable resin composition is excellent in pixel transparency and pattern accuracy, among others, and therefore can serve as an element in a high-performance, high-quality liquid crystal display.

The present invention is thus further directed to a liquid crystal display which comprises the above color filter, an electrode substrate opposing thereto, and a liquid crystal compound sealed between both.

The liquid crystal display of the present invention can be produced by forming an alignment film on the inner side of the above color filter, opposing the same to the electrode substrate, and filling the gap between them with a liquid crystal compound, followed by sealing. The liquid crystal compound and other materials to be used in the liquid crystal display of the present invention are not particularly restricted. The electrode substrate may be one produced by a conventional method. Such liquid crystal display can perform the effects of the above ionizing radiation-curable resin composition to the full and is excellent not only in basic performance characteristics but also in quality of images displayed, hence can judiciously be used as a display of a flat display, such as a personal computer, among others.

EXPLANATION OF SYMBOLS

Figure 1:
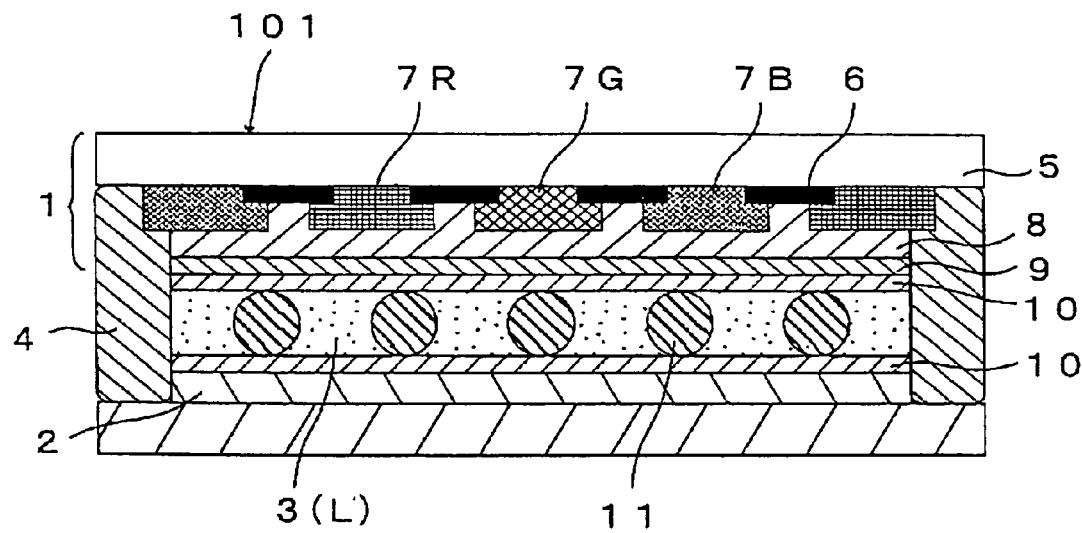
FIG. 1 is a schematic cross-section of a liquid crystal panel.
Figure 2:
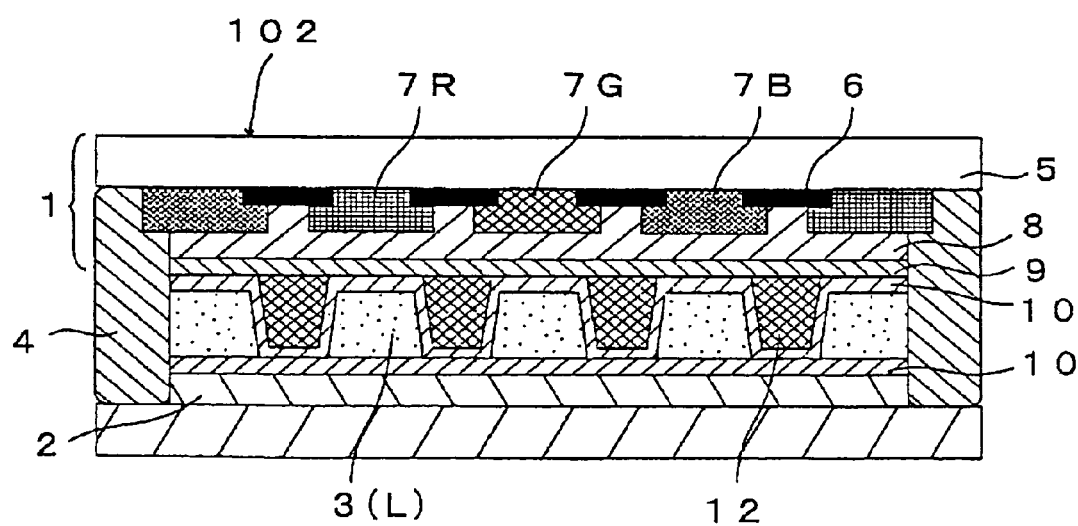
FIG. 2 is a schematic cross-section of another liquid crystal panel.

1 Color filter
2 Electrode substrate
3 Cell gap (L: liquid crystal compound)
4 Sealing material
5 Transparent substrate
6 Black matrix layer
7 (7R, 7G, 7B) Colored layers
8 Protective layer
9 Transparent electrode film
10 Alignment film
11 Pearl
12 Pillar-like spacer
101, 102 Liquid crystal panel

BEST MODE FOR CARRYING OUT THE INVENTION

The following examples illustrate the present invention in further detail without defining the scope of the invention. It should be understood that unless otherwise indicated, all "part(s)" means "part(s) by mass" and "%" means "% by mass".

The methods of analysis used in the examples and comparative examples are shown below.

(1) Unreacted Monomers, Polymer Composition

These were determined by assaying unreacted monomers at the time of completion of polymerization by gas chromatography.

(2) Solubility in 1% KOH

The polymerization mixture was diluted with tetrahydrofuran (THF), the dilution was poured into a large amount of hexane, the resultant precipitate was collected by filtration and dried, the thus-recovered polymer fraction was placed in a 1% aqueous solution of KOH in an amount to give a polymer concentration of 20%, and the mixture was stirred for 3 hours. After stirring, the insoluble matter, if any, was collected by filtration and measured.

⊚: complete dissolution, ○: very slight turbidity—insoluble matter content up to 10%, Δ: insoluble matter content 10 to 50%, ×: insoluble matter content 50% or more.

(3) Solubility in Propylene Glycol Monomethyl Ether Acetate (PGMEA) and in 3-methoxybutyl Acetate Each solvent was added to the precipitated and isolated polymer to give a concentration of 20%, and the mixture was warmed to 60° C. and stirred for 3 hours and then allowed to cool to room temperature. The insoluble matter, if any, was collected by filtration and weighed.

⊚: complete dissolution, ○: very slight turbidity—insoluble matter content up to 10%, Δ: insoluble matter content 10 to 50%, ×: insoluble matter content 50% or more.

(4) Transmittance at 380 Nm

The copolymer solution was diluted with diethylene glycol dimethyl ether (DMDG) to a polymer concentration of 20%, and the dilution was applied to a glass substrate using a spin coater, and the coat film formed was dried at room temperature for 30 minutes then dried by heating at 90° C. for 30 minutes and then at 200° C. for 30 minutes to give a 2-μm-thick film. The film was then heated at 250° C. for 1 hour and measured for light transmittance in the wavelength range of 380 to 780 nm.

(5) Glass Transition Temperature

DSC Measurement Conditions Etc.

The polymer itself was subjected to measurement in a nitrogen atmosphere while raising the temperature at a rate of 10° C./minute using a Rigaku Denki's model DSC 8230 (trademark) differential scanning calorimeter.

(6) Weight Average Molecular Weight (Mw)

The weight average molecular weight was determined on Shodex GPC System 21H (trademark, product of Shodex) using polystyrene standard substances with THF as an eluent.

(7) Acid Value

A 3-g portion of each resin solution was accurately weighed and dissolved in a mixed solvent composed of 70 g of acetone and 30 g of water, the solution was titrated with a 0.1 N aqueous solution of KOH with Thymol Blue as an indicator, and the acid value per gram of solid matter was calculated based on the solid matter concentration.

EXAMPLE 1

Synthesis of an Alkali-Soluble Maleimide Polymer

A 3-L polymerization vessel was charged with 44 parts of diethylene glycol dimethyl ether (DMDG) as a solvent, the temperature was raised to 90° C. in a nitrogen atmosphere, and a solution, at 60° C., composed of 16 parts of cyclohexylmaleimide (CHMI) and 16 parts of diethylene glycol dimethyl ether (as dropping system 1), a mixture composed of 14 parts of methyl methacrylate (MMA), 10 parts of methacrylic acid (MAA) and 0.4 part of Perbutyl O (trademark, product of NOF Corp.) (as dropping system 2), and 0.5 part of n-dodecylmercaptan (as dropping system 3) were respectively fed to the polymerization vessel continuously over 3 hours. Thereafter, the temperature was maintained at 90° C. for 30 minutes and then raised to 105° C. and the polymerization was continued for 3 hours. The copolymer solution (copolymer 1 solution) was sampled for molecular weight determination by GPC. The weight average molecular weight (Mw) was 28,000. The unreacted monomers as determined by gas chromatography were: CHMI 0.9%, MMA 0.8%, and MAA 0.4%.

The polymerization mixture was diluted with DMDG to a polymer concentration of 20%, the dilution was applied to an alkali-free glass sheet using a spin coater to form a 2-μm-thick film, and the film was heated at 250° C. for 1 hour using a hot plate and then measured for light transmittance. The light transmittance in the range of 380 to 780 nm was not less than 99%. The polymerization mixture obtained was diluted with tetrahydrofuran (THF), the dilution was poured into a large amount of hexane to precipitate the copolymer, followed by polymer separation by filtration and drying. The copolymer 1 was recovered by two repetitions of this procedure. This copolymer 1 was absolutely soluble in 1% aqueous KOH, propylene glycol monomethyl ether acetate (PGMEA) and 3-methoxybutyl acetate. The acid value as determined by titration was 163 mg KOH/g, and the glass transition temperature as determined by DSC was 203° C.

EXAMPLES 2 AND 3

Alkali-soluble maleimide-based copolymer solutions (copolymer 2 solution and copolymer 3 solution) were produced following the same procedure as in Example 1 except that the charges for polymerization were changed as specified in Table 1. The analytical values for the copolymers 2 and 3 are shown in Table 1.

COMPARATIVE EXAMPLES 1 AND 2

Maleimide-based copolymer solutions (comparative copolymer 1 solution and comparative copolymer 2 solution) were produced following the same procedure as in Example 1 except that the charges for polymerization were changed as specified in Table 1. The analytical values for the comparative copolymers 1 and 2 are shown in Table 1. The comparative copolymer 1 was insoluble in PGMEA or 3-methoxybutyl acetate and 20% of the copolymer remained insoluble in 1% aqueous KOH. The comparative copolymer 2 was absolutely soluble in 1% aqueous KOH but was not soluble in PGMEA or 3-methoxybutyl acetate.

COMPARATIVE EXAMPLE 3

A maleimide-based copolymer solution (comparative copolymer 3 solution) was obtained following the same procedure as in Example 1 except that phenylmaleimide (PMI) was used in lieu of CHMI. The analytical values for the comparative copolymer 3 are shown in Table 1. After 1 hour of heating at 250° C., the comparative copolymer 3 was measured for light transmittance in the range of 380 to 780 nm. The transmittance in the region not shorter than 450 nm was not less than 98% but the transmittance at 380 nm was 96%.

up the materials shown below with stirring at room temperature.

Alkali-soluble maleimide-based copolymer solution 1 (solid matter content 20%): 69.0 parts

TABLE 1

| | | Example 1 | Example 2 | Example 3 | Compar. Ex. 1 | Compar. Ex. 2 | Compar. Ex. 3 |
|---|---|---|---|---|---|---|---|
| | | | | Copolymer | | | |
| | | Copolymer 1 | Copolymer 2 | Copolymer 3 | Compar. Copolymer 1 | Compar. copolymer 2 | Compar. Copolymer 3 |
| Initial charge (parts by mass) | DMDG | 44 | 48 | 52 | 36 | 44 | 44 |
| Dropwise charging (parts by mass) | CHMI | 16 | 12 | 8 | 24 | 16 | — |
| | PMI | — | — | — | — | — | 16 |
| | MMA | 14 | 20 | 26 | — | 8 | 14 |
| | HEMA | — | — | — | 8 | — | — |
| | MAA | 10 | 8 | 6 | 8 | 16 | 10 |
| | DMDG | 16 | 12 | 8 | 24 | 16 | 16 |
| | PBO | 0.4 | 0.4 | 0.4 | 0.4 | 0.4 | 0.4 |
| | n-DM | 0.5 | 0.5 | 0.5 | 0.5 | 0.5 | 0.5 |
| Unreacted monomers at time of completion of polymerization (% by mass) | CHMI | 0.9 | 0.1 | 0.05 | 3.1 | 2.2 | — |
| | PMI | — | — | — | — | — | 0.01 |
| | MMA | 0.8 | 0.6 | 0.4 | — | 0.2 | 0.2 |
| | HEMA | — | — | — | 0.1 | — | — |
| | MAA | 0.4 | 0.1 | 0.1 | 0.1 | 0.9 | 0.03 |
| Copolymer composition (% by mass) | CHMI | 40 | 30 | 20 | 60 | 40 | — |
| | PMI | — | — | — | — | — | 40 |
| | MMA | 35 | 50 | 65 | — | 20 | 35 |
| | HEMA | — | — | — | 20 | — | — |
| | MAA | 25 | 20 | 15 | 20 | 40 | 25 |
| | Mw | 28000 | 24000 | 22000 | 32000 | 32000 | 29000 |
| 0.4 × X | | 16 | 12 | 8 | 24 | 16 | 0 |
| Y | | 25 | 20 | 15 | 20 | 40 | 25 |
| 0.5 × X + 10 | | 30 | 25 | 20 | 40 | 30 | 10 |
| Acid value (mg KOH/g) | | 163 | 130 | 98 | 130 | 260 | 163 |
| Tg (° C.) | | 203 | 176 | 151 | 222 | 227 | 194 |
| Solubility | 1% KOH | ○ | ◎ | ◎ | Δ | ◎ | ○ |
| | PGMEA | ◎ | ◎ | ◎ | X | X | Δ |
| | MBA | ◎ | ◎ | ◎ | X | X | Δ |
| Transmittance at 380 nm(%) | | 99 | 99 | 99 | 92 | 95 | 96 |

Remarks are now made about Table 1. DMDG stands for diethylene glycol dimethyl ether, CHMI for cyclohexylmaleimide, PMI for phenylmaleimide, MMA for methyl methacrylate, HEMA for 2-hydroxyethyl methacrylate, MAA for methacrylic acid, PBO for Perbutyl O (trademark, product of NOF Corp.), n-DM for n-dodecylmercaptan, PGMEA for propylene glycol monomethyl ether acetate, and MBA for 3-methoxybutyl acetate.

The values of 0.4×X, Y and 0.5×X+10 are also given, where X (%) is the N-cyclohexylmaleimide monomer unit percentage and Y (%) is the (meth)acrylic acid monomer unit percentage.

EXAMPLE 4

Preparation of Curable Resin Composition 1

The copolymer 1 obtained in Example 1 was again dissolved in DMDG to give an alkali-soluble maleimide-based copolymer solution 1 with a solid matter content of 20%. A curable resin composition 1 was prepared by mixing Dipentaerythritol pentaacrylate (product of Sartomer Co., trademark "SR 399"): 11.0 parts Orthocresol novolak-based epoxy resin (product of Yuka Shell Epoxy, trademark "Epikote 180 S 70"): 15.0 parts 2-Methyl-1-(4-methylthiophenyl)-2-morpholinopropanone-1: 2.1 parts 2,2'-Bis(o-chlorophenyl)-4,5,4',5'-tetraphenyl-1,2'-biimidazole: 1.5 parts Diethylene glycol dimethyl ether: 66.0 parts The curable resin composition 1 was evaluated by the following methods. The results are shown in Table 2.

Cured Film Physical Property Evaluation

A coat film having a dry thickness of 5.4 μm was formed on a 10-cm-square glass substrate by applying thereto the curable resin composition 1 by means of a spin coater (product of MIKASA, model 1H-DX2), followed by drying. This film was heated at 90° C. for 3 minutes on a hot plate. After heating, the film was irradiated with ultraviolet rays at an intensity of 100 mJ/cm² (as illuminance at 405 nm) using a UV aligner (product of Dainippon Screen Mfg. Co., model MA 1200) equipped with a 2.0 kW ultrahigh pressure mercury lamp. After ultraviolet irradiation, the coat film was dried at 200° C. for 30 minutes in a clean oven (product of Oshitari Laboratory, trademark "SCOV-250 Hy-So") to give a 5.0-μm-thick cured film. The hardness of the cured film obtained was evaluated in terms of universal hardness (testing load/surface area of Vickers indenter under testing load) by measuring the surface hardness using an ultramicro hardness tester (product of Fischer Instruments, trademark "WIN-HCU") at the time when the surface temperature of the cured film heated by means of a heating tool arrived at 180° C. and under conditions such that the maximum load of the Vickers intender amounted to 20 mN.

Elastic Deformation Modules

A coat film having a dry thickness of 5.4 μm was formed on a 10-cm-square glass substrate by applying thereto the curable resin composition 1 by means of a spin coater (product of MIKASA, model 1H-DX2), followed by drying. This film was heated at 90° C. for 3 minutes on a hot plate. After heating, the film was irradiated with ultraviolet rays at an intensity of 100 mJ/cm$^2$ (as illuminance at 405 nm) using a UV aligner (product of Dainippon Screen Mfg. Co., model MA 1200) equipped with a 2.0 kW ultrahigh pressure mercury lamp. After ultraviolet irradiation, the coat film was dried at 200° C. for 30 minutes in a clean oven (product of Oshitari Laboratory, trademark "SCOV-250 Hy-So") to give a 5.0-μm-thick cured film. The hardness of the cured film obtained was evaluated in terms of percentage of work for elastic deformation relative to total work by measuring the surface hardness using an ultramicro hardness tester (product of Fischer Instruments, trademark "WIN-HCU") at the time when the surface temperature of the cured film heated by means of a heating tool arrived at 180° C. and under conditions such that the maximum load of the Vickers intender amounted to 20 mN.

Developability Evaluation

A coat film having a dry thickness of 2.2 μm was formed on a 10-cm-square glass substrate by applying thereto the curable resin composition 1 by means of a spin coater (product of MIKASA, model 1H-DX2), followed by drying. This film was heated at 90° C. for 3 minutes on a hot plate. After heating, the film was irradiated with ultraviolet rays at an intensity of 100 mJ/cm$^2$ (as illuminance at 405 nm) using a UV aligner (product of Dainippon Screen Mfg. Co., model MA 1200) equipped with a 2.0 kW ultrahigh pressure mercury lamp through a photomask disposed at a distance of 100 μm from the coat film.

After ultraviolet irradiation, a 0.05% aqueous solution of potassium hydroxide was sprayed over the coat film using a spin developer (product of Applied Process Technology, Inc., Model 915) for 60 seconds, to thereby dissolve and remove unexposed portions. The exposed portions were washed with pure water for 60 seconds for development. After development, the exposed film portions were heated at 200° C. for 30 minutes in a clean oven (product of Oshitari Laboratory, trademark "SCOV-250 Hy-So"). For developability evaluation, the thus-obtained film was evaluated by relief pattern observation using an optical microscope (product of Olympus Optical Co., trademark "MHL 100") and a stylus type surface roughness measuring apparatus (product of Nippon Anelva, trademark "Dektak 1600"). When the relief pattern was poor, the developability was evaluated as ×, when good, as ○, and when very good, as ⊚.

Coat Film Surface Roughening

After alkali development treatment, the coat film surface was observed with a microscope and the smoothness of the film surface was evaluated.

⊚: very smooth, ○: smooth, Δ: surface roughening observable, ×: intense surface roughening with film whitening.

Resistance for Warm Pure Water

The coat film after curing was immersed in pure water at 80° C. for 30 minutes and then checked for adherence by cross cut peel testing.

○: no film peeling, Δ: less than 50% film peeling, defective ×: 50% or more film peeling, defective.

EXAMPLES 5 AND 6

Preparation of Curable Resin Composition 2 and Curable Resin Composition 3

Curable resin compositions 2 and 3 were prepared in the same manner as in Example 4 except that the copolymer 2 obtained in Example 2 or the copolymer 3 obtained in Example 3 was used in lieu of the copolymer 1 obtained in Example 1. Using these curable resin compositions 2 and 3, coat films were formed and evaluated in the same manner as in Example 4. The results are shown in Table 2.

COMPARATIVE EXAMPLES 4 TO 6

Preparation of Curable Resin Compositions 4 to 6

Curable resin compositions 4 to 6 were prepared in the same manner as in Example 4 except that the comparative copolymers 1 to 3 obtained in Comparative Examples 1 to 3 were respectively used in lieu of the copolymer obtained in Example 1. Using these curable resin compositions, coat films were formed and evaluated in the same manner as in Example 4. The results are shown in Table 2.

TABLE 2

|  | Example 4 | Example 5 | Example 6 | Compar. Ex. 4 | Compar. Ex. 5 | Compar. Ex. 6 |
| --- | --- | --- | --- | --- | --- | --- |
| Curable resin composition | 1 | 2 | 3 | 4 | 5 | 6 |
| Transmittance at 380 nm(%) | 92 | 92 | 93 | 85 | 85 | 87 |
| Hardness at 180° C. (N/mm$^2$) | 220 | 215 | 210 | 225 | 215 | 215 |
| Elastic deformation modules(%) | 32 | 33 | 31 | 27 | 26 | 28 |
| Developability | ⊚ | ⊚ | ⊚ | Δ | Δ | Δ |
| Coat film surface roughening | ○ | ○ | ⊚ | X | X | ○ |
| Resistance for warm pure water | ○ | ○ | ○ | X | X | ○ |

EXAMPLE 7

Synthesis of an Alkali-Soluble Maleimide-Based Copolymer

An alkali-soluble maleimide-based copolymer solution (copolymer 4 solution) was produced following the same procedure as in Example 1 except that the charges for polymerization were changed as specified in Table 3. The analytical values for the copolymer 4 are shown in Table 3.

EXAMPLES 8 AND 9

Alkali-soluble maleimide-based copolymer solutions (copolymer 5 solution and copolymer 6 solution) were produced following the same procedure as in Example 7 except that the charges for polymerization were changed as specified in Table 3. The analytical values for the copolymers 5 and 6 are shown in Table 3.

TABLE 3

|  |  | Example 7 | Example 8 | Example 9 |
|---|---|---|---|---|
|  |  | Copolymer |  |  |
|  |  | Copolymer 4 | Copolymer 5 | Copolymer 6 |
| Initial charge (parts by mass) | DMDG | 44 | 48 | 52 |
| Dropwise charging (parts by mass) | BzMI | 16 | 12 | 8 |
|  | PMI | — | — | — |
|  | MMA | 14 | 20 | 26 |
|  | MAA | 10 | 8 | 6 |
|  | DMDG | 16 | 12 | 8 |
|  | PBO | 0.4 | 0.4 | 0.4 |
|  | n-DM | 0.5 | 0.5 | 0.5 |
| Unreacted monomers at time of completion of polymerization (% by mass) | BzMI | 1.2 | 0.1 | 0.02 |
|  | PMI | — | — | — |
|  | MMA | 0.3 | 0.3 | 0.3 |
|  | MAA | 0.2 | 0.1 | 0.05 |
| Copolymer composition (% by mass) | BzMI | 40 | 30 | 20 |
|  | PMI | — | — | — |
|  | MMA | 35 | 50 | 65 |
|  | MAA | 25 | 20 | 15 |
| Mw |  | 28000 | 24000 | 22000 |
| Acid value (mg KOH/g) |  | 163 | 130 | 98 |
| Tg (° C.) |  | 203 | 176 | 151 |
| Solubility | 1% KOH | ○ | ⊚ | ⊚ |
|  | PGMEA | ⊚ | ⊚ | ⊚ |
|  | MBA | ⊚ | ⊚ | ⊚ |
| Transmittance at 380 nm(%) |  | 99 | 99 | 99 |

Remarks are now made about Table 3. BzMI stands for benzylmaleimide, and the other abbreviations respectively have the same meanings as in Table 1.

EXAMPLES 10 TO 12

Preparation of Curable Resin Compositions 7 to 9

Curable resin compositions 7 to 9 were prepared in the same manner as in Example 4 except that the copolymers 4 to 6 obtained in Examples 7 to 9 were respectively used in lieu of the copolymer 1. These curable resin compositions were respectively evaluated for coat film physical properties, elastic deformation modules, developability, coat film surface roughening, and resistance for warm pure water in the same manner as in Example 4. The results are shown in Table 4.

TABLE 4

|  | Example 10 | Example 11 | Example 12 |
|---|---|---|---|
| Curable resin composition | 7 | 8 | 9 |
| Transmittance at 380 nm(%) | 92 | 92 | 93 |
| Hardness at 180° C. (N/mm$^2$) | 220 | 215 | 215 |
| Elastic deformation modules (%) | 32 | 33 | 31 |
| Developability | ⊚ | ⊚ | ⊚ |
| Coat film surface roughening | ○ | ○ | ⊚ |
| Resistance for warm pure water | ○ | ○ | ○ |

EXAMPLE 13

A 30-L polymerization vessel was charged with 40.0 parts of diethylene glycol dimethyl ether (DMDG) as a solvent, the temperature was raised to 90° C. in a nitrogen atmosphere, and a mixture (as dropping system 1) composed of 6.16 parts of cyclohexylmaleimide (CHMI), 6.16 parts of diethylene glycol dimethyl ether (DMDG), 12.12 parts of methyl methacrylate (MMA) and 12.55 parts of methacrylic acid (MAA), 0.62 part of Perbutyl O (PBO) (trademark, product of NOF Corp.) (as dropping system 2), and 1.23 parts of n-dodecylmercaptan (n-DM) (as dropping system 3) were respectively fed to the polymerization vessel continuously over 3 hours. Thereafter, the temperature was maintained at 90° C. for 30 minutes and then raised to 105° C. and the polymerization was continued for 3 hours. The unreacted monomers as determined by gas chromatography (GC) were: CHMI 0.1%, MMA 0.2%, and MAA 0.3%.

Then, to this reaction mixture were added 12.73 parts of glycidyl methacrylate (GMA), 0.13 part of triethylamine as a catalyst, and 0.07 part of 2,2'-methylenebis(4-methyl-6-tert-butylphenol) (trademark "Antage W400", product of Kawaguchi Chemical Industry) as a polymerization inhibitor, and the reaction was allowed to proceed for 8 hours while an air-nitrogen mixed gas adjusted to an oxygen concentration of 5% was bubbled through the mixture at a flow rate of 200 mL/minute. Upon GC analysis of the reaction mixture, no unreacted GMA was detected. The mixture was diluted by adding 7.5 parts of DMDG, and then cooled to a give a cyclohexylmaleimide resin solution (copolymer 7 solution).

Analysis and Evaluation

The copolymer 7 solution obtained in Example 13 was sampled and analyzed by the methods mentioned above and by the methods mentioned below. The results are shown in Table 5, together with the amounts of the materials charged.

(1) Methods of Analysis of Copolymer 7 Solution

Solid Matter Content

A 1.0-g portion of the resin solution was accurately weighed on an aluminum dish and then deprived of the volatile matter by vacuum drying at 160° C. for 5 hours. The solid matter content was calculated based on the mass of the residue.

Double Bond Equivalent

For calculating the double bond equivalent, the mass of the monomers consumed was calculated from the monomer mass used and the residual monomer mass as determined by gas chromatography and then divided by the number of moles of GMA consumed.

Double bond equivalent=(mass of polymer obtained)/(number of moles of double bond introduced)=(mass of monomers consumed)/(number of moles of GMA consumed)

EXAMPLE 14

An alkali-soluble maleimide-based copolymer solution was produced following the same procedure as in Example 1 except the charges for polymerization were modified as specified in Table 5. The copolymer solution obtained was sampled and measured for molecular weight by GPC. The weight average molecular weight (Mw) was 21,000. The unreacted monomers as determined by gas chromatography (GC) were: CHMI 0.1%, MMA 0.2%, and MAA 0.3%.

Then, to this solution were added 19.8 parts of glycidyl methacrylate (GMA), 0.075 part of triethylamine as a catalyst, and 0.075 part of 2,2'-methylenebis(4-methyl-6-tert-butylphenol (trademark "Antage W400", product of Kawaguchi Chemical Industry) as a polymerization inhibitor, and the reaction was allowed to proceed for 12 hours while an air-nitrogen mixed gas adjusted to an oxygen concentration of 5% was bubbled through the mixture at a flow rate of 60 mL/minute. Upon GC analysis of the reaction mixture, no unreacted GMA was detected. Upon GPC analysis of the polymerization mixture, the weight average molecular weight was 38,000.

The copolymer was analyzed in the same manner as in Example 13. The analytical values for the copolymer 8are shown in Table 5.

EXAMPLE 15

An alkali-soluble maleimide-based copolymer solution (copolymer 9 solution) was produced following the same procedure as in Example 14 except that the charges for polymerization were modified as specified in Table 5. The analytical values for the copolymer 9 are shown in Table 5.

EXAMPLE 16

An alkali-soluble maleimide-based copolymer solution (copolymer 10 solution) was produced following the same procedure as in Example 13 except that the charges for polymerization were modified as specified in Table 5. The analytical values for the copolymer (copolymer 10) are shown in Table 5.

COMPARATIVE EXAMPLE 7

A maleimide-based copolymer solution (comparative copolymer 4 solution) was produced following the same procedure as in Example 14 except that the charges for polymerization were modified as specified in Table 5. The analytical values for this comparative copolymer 4 are shown in Table 5.

TABLE 5

|  |  |  | Example 13 | Example 14 | Example 15 | Example 16 | Compar. Ex. 7 |
|---|---|---|---|---|---|---|---|
|  |  |  | | | Copolymer | | |
|  |  |  | Copolymer 7 | Copolymer 8 | Copolymer 9 | Copolymer 10 | Compar. Copolymer 4 |
| Amount of charging (parts by mass) | Initial charge | DMDG | 40.0 | 48 | 48 | 40.0 | 48.0 |
| | Dropping system 1 | CHMI | 6.16 | 12 | 12 | — | 12 |
| | | BzMI | — | — | — | 6.16 | — |
| | | DMDG | 6.16 | 12 | 12 | 6.16 | 12 |
| | | MMA | 12.12 | 8 | 20 | 12.12 | — |
| | | MAA | 12.55 | 20 | 8 | 12.55 | 27 |
| | Dropping system 2 | PBO | 0.62 | 0.4 | 0.4 | 0.62 | 0.4 |
| | Dropping System 3 | n-DM | 1.23 | 0.6 | 0.6 | 1.23 | 0.6 |
| | Glycidyl Introduction | GMA | 12.73 | 19.8 | 3.3 | 12.73 | 38 |
| | | Triethylamine | 0.13 | 0.075 | 0.075 | 0.13 | 0.075 |
| | | Polymerization inhibitor | 0.07 | 0.075 | 0.075 | 0.07 | 0.075 |
| Results of analysis | Unreacted monomers at time of completion of polymerization (% by mass) | CHMI | 0.1 | 0.1 | 0.1 | — | 0.2 |
| | | BzMI | — | — | — | 0.1 | — |
| | | MMA | 0.2 | 0.2 | 0.4 | 0.2 | — |
| | | MAA | 0.3 | 0.3 | 0.1 | 0.3 | 0.4 |
| | | GMA | — | — | — | — | 0.3 |
| | Copolymer composition (% by mass) | CHMI | 14.0 | 20.0 | 27.7 | — | 15.6 |
| | | BzMI | — | — | — | 14.0 | — |
| | | MMA | 28.0 | 13.4 | 46.2 | 28.0 | — |
| | | MAA | 11.1 | 13.4 | 13.9 | 11.1 | 5.2 |
| | | GMA/MAA | 46.9 | 53.2 | 12.2 | 46.5 | 79.2 |
| | Relation between X and Y | 0.4 × X | 5.6 | 8 | 11.1 | 5.6 | 6.24 |
| | | Y | 11.1 | 13.4 | 13.9 | 11.1 | 5.2 |
| | | 0.5 × X + 10 | 17.0 | 20 | 23.85 | 17.0 | 17.8 |
| | Solid content(% by mass) | | 44.7 | 50 | 42 | 44.7 | 56 |
| | Acid value (mg KOH/g) | | 75.1 | 105 | 105 | 75.1 | 40 |
| | Mw | | 15000 | 3800 | 24000 | 15000 | 48000 |
| | Double bond equivalent | | 490 | 438 | 1910 | 490 | 287 |

TABLE 5-continued

|  |  | Example 13 | Example 14 | Example 15 | Example 16 | Compar. Ex. 7 |
|---|---|---|---|---|---|---|
|  |  |  |  | Copolymer |  |  |
|  |  | Copolymer 7 | Copolymer 8 | Copolymer 9 | Copolymer 10 | Compar. Copolymer 4 |
| Solubilty | 1% KOH | ⊚ | ⊚ | ⊚ | ⊚ | Δ |
|  | PGMEA | ⊚ | ⊚ | ⊚ | ⊚ | ○ |
|  | MBA | ⊚ | ⊚ | ⊚ | ⊚ | ○ |
| Transmittance at 380 nm(%) |  | ≧99% | ≧99% | ≧99% | ≧99% | ≧96% |

Remarks are now made about Table 5. GMA stands for glycidyl methacrylate, and the other abbreviations respectively have the same meanings as in Table 1 and Table 3.

EXAMPLES 17 TO 20

Preparation of Curable Resin Compositions 10 to 13

Curable resin compositions 10 to 13 were prepared in the same manner as in Example 4 except that the copolymers 7 to 10 obtained in Examples 13 to 16 were respectively used in lieu of the copolymer 1. These curable resin compositions were respectively evaluated for coat film physical properties, elastic deformation modules, developability, coat film surface roughening, and resistance for warm pure water in the same manner as in Example 4. The results are shown in Table 6.

COMPARATIVE EXAMPLE 8

Preparation of Curable Resin Composition 14

Curable resin compositions 14 was prepared in the same manner as in Example 4 except that the comparative copolymer 7 obtained in Comparative Example 7 was used in lieu of the copolymer 1. Using this curable resin composition, coat films were formed and evaluated in the same manner as in Example 4. The results are shown in Table 6.

increased hydrophilicity of excess hydroxyl groups formed upon double bond introduction.

EXAMPLE 21

Preparation of a Blue Pigment Dispersion Composition

A pigment, a dispersant and the copolymer 7 solution obtained in Example 13 were mixed together and beads-dispersed in the proportions given below using a paint shaker with 0.3-mm zirconia beads for 3 hours to give a blue pigment dispersion composition (1). The solid matter mass ratio of pigment, dispersant and cyclohexylmaleimide resin (pigment/dispersant/cyclohexylmaleimide resin) in the blue pigment dispersion composition 1 obtained was 1/0.2/0.4.

Composition of Blue Pigment Dispersion Composition 1
Pigment blue 15:6 (copper phthalocyanine blue pigment, trademark "CFB 6340 EC", product of Dainichiseika Color & Chemicals Mfg.): 13 parts
Dispersant (trademark "Disper BYK 2001", product of BYK Chemie): 5.65 parts (solid matter content 46.0%)
Copolymer 7 solution (CHMI/MMA/MAA/GMA-MAA copolymer, solid matter content 44.7%): 11.56 parts
Propylene glycol monomethyl ether acetate: 69.79 parts Preparation of a Blue Resist The copolymer 7 solution and other components were incorporated in the blue pigment dispersion composition 1 in the proportions shown below to give a blue pigment resist

TABLE 6

|  | Example 17 | Example 18 | Example 19 | Example 20 | Compar. Ex. 8 |
|---|---|---|---|---|---|
| Curable resin composition | 10 | 11 | 12 | 13 | 14 |
| Transmittance at 380 nm(%) | 92 | 92 | 93 | 93 | 93 |
| Hardness at 180° C. (N/mm²) | 240 | 260 | 230 | 240 | 270 |
| Elastic deformation modules(%) | 33 | 32 | 31 | 32 | 28 |
| Developability (Light exposure 100 mJ/cm²) | ⊚ | ⊚ | ⊚ | ⊚ | ⊚ |
| Coat film surface roughening | ⊚ | ⊚ | ⊚ | ⊚ | ⊚ |
| Resistance for warm pure water | ○ | ○ | ○ | ○ | X |
| Developability (Light exposure 50 mJ/cm²) | ⊚ | ⊚ | ⊚ | ⊚ | ⊚ |
| Coat film surface roughening | ⊚ | ⊚ | ⊚ | ⊚ | ⊚ |
| Resistance for warm pure water | ○ | ○ | ○ | ○ | X |

As can be seen from Table 6, the ionizing radiation-curable resin compositions produced in Examples 17 to 20 could be developed at lower light exposure levels and, in addition, could form hard coat films. In Comparative Example 8, the double bond content was excessive, hence curing proceeded to an excessive extent, with the result that the curing shrinkage increased and the adherence of the exposed portions to the substrate decreased due to the (1). The solod matter mass ratio of the main polymer cyclohexylmaleimide resin, monomer dipentaerythritol pentaacrylate (trademark "Sartomer SR 399E", product of Nippon Kayaku) and initiators 1 and 2 (cyclohexylmaleimide resin/dipentaerythritol pentaacrylate/sum of initiators 1 and 2) in the blue resist 1 obtained was 35/45/35.

Composition of Blue Resist 1
Blue pigment dispersion composition 1: 34.3 parts

Copolymer 7 solution (CHMI/MMA/MAA/GMA-MAA copolymer, solid matter content 44.7%): 8.03 parts Dipentaerythritol pentaacrylate (trademark "Sartomer SR 399E", product of Nippon Kayaku): 6.03 parts Initiator 1 (trademark "Irgacure 907", product of Ciba Specialty Chemicals): 3.87 parts Initiator 2 (trademark "Hicure ABP", product of Kawaguchi Chemical Co.): 0.35 part Propylene glycol monomethyl ether acetate: 52.6 parts

COMPARATIVE EXAMPLE 9

A comparative blue pigment dispersion composition (C1) was prepared in the same manner as in Example 21 except that the composition thereof was the blue pigment dispersion composition 1 minus the copolymer 7 solution. Further, a comparative blue resist (C1) was prepared in the same manner as in Example 21 except that an acrylic resin (trademark "B-7500", product of Shin-Nakamura Chemical) was used in lieu of the copolymer 7 solution.

The blue pigment dispersion compositions and blue resists obtained in Example 21 and Comparative Example 9 were evaluated by the methods described below. The results are shown in Table 7.

(2) Evaluation Methods for Blue Pigment Dispersion Composition and Blue Resist (2-1) Pigment Dispersibility The 50% mean pigment particle diameter of each blue pigment dispersion composition was measured using Nikkiso's laser Doppler scattered light analysis type particle size analyzer (trademark "Microtrac 934 UPA").

(2-2) Mode of Development, Developing Time, Spectral Characteristics, Heat Resistance, Cross-Section Configuration of Pattern The blue resist was applied onto an alkali-washed glass substrate by spin coating, and dried at room temperature for 3 minutes and then on a hot plate at 80° C. for 3 minutes to form a 1.3-μm-thick coat film. This film was mask-exposed to light at 100 mJ/cm$^2$, spin-developed, contacted with a developer for 60 seconds and then washed with pure water, and the thus-patterned substrate was baked in an oven at 230° C. for 30 minutes. In this process of development, observation was performed as to whether the mode of development was of the dissolution type or peeling type and, at the same time, the developing time was measured.

Then, the obtained blue pattern-carrying substrate was measured for the brightness Y value as defined in JIS Z 8701 using Olympus Optical's microspectrophotometer (trademark "OSP SP-100") and the light source C as defined by the International Commission on Illumination (CIE). Thereafter, this blue pattern-carrying substrate was heated in an oven at 250° C. for 1 hour, and the brightness Y value was then measured in the same manner, and the change in Y value after heat resistance testing was calculated based on the Y value before testing. The cross-section configuration of the colored layer of the blue pattern-carrying substrate obtained at the stage after 30 minutes of baking at 230° C. was observed under a SEM (scanning electron microscope) and, at the same time, the rising angle and the upper base length-to-lower base length ratio of the colored layer were calculated using a SEM photograph.

(2-3) Residues upon Development

The liquid blue resist was applied to a glass substrate vapor-deposited with chromium on reverse side by spin coating and then dried at room temperature for 3 minutes and then on a hot plate at 80° C. for 3 minutes to form a 1.3-μm-thick coat film. This film was subjected to spin development, contacted with a developer for 60 seconds, and then washed with pure water.

After washing, the glass substrate was visually examined for residues using a projector. Further, the substrate surface was wiped with a waste wetted with ethanol, and the presence or absence of residues wiped off onto the waste was checked.

(2-4) Contrast Ratio

The blue resist-coated substrate obtained above in (2-2) was sandwiched between two polarizers (products of Nitto Denko Corp., trademark "NPF-G 1220DU") and a backlight (product of Toshiba, trademark "Mellow 5D FL10EX-D-H", color temperature 6,500K) was switched on, and the luminance through perpendicular configuration polarizers and luminance through parallel configuration polarizers were measured using a luminance meter (product of Minolta, trademark "SL-100"). The contrast ratio can be calculated using the following equation:

Contrast ratio={luminance through parallel configuration polarizers (cd/cm$^2$)}/{luminance through perpendicular configuration polarizers (cd/cm$^2$)}

(2-5) Adherence, Dissolution, and Cross Cut Peel Test

Photoengraving characteristics (line and space adherence and dissolution, cross cut peel test) were evaluated.

The same procedure as the developability evaluation procedure in Example 4 was followed using the blue resist obtained in Example 21 in lieu of the curable resin composition 1, and the coat film formed was treated with an alkali (0.05% by mass aqueous solution of potassium hydroxide). After development, the light-exposed portions of the film was heated at 200° C. for 30 minutes in a clear oven (product of Oshitari Laboratory, trademark "SCOV-250 Hy-So").

Further, the coated film was irradiated with ultraviolet rays by a UV aligner (product of Dainippon Screen Mfg. Co., model MA 1200) equipped with a 2.0-kW ultrahigh pressure mercury lamp, with a photomask disposed at a distance of 100 μm from the coat film via a line and space mask, at an intensity of 100 mJ/cm$^2$ (as illuminance at 405 nm), and the configuration of the relief pattern obtained was observed under an optical microscope (product of Olympus Optical, trademark "rMHL 100") and the line width at which coat film defects occur (adherence) and the dissolution were determined.

Furthermore, the adherence (resistance for warm pure water) was evaluated by the same method as the above-mentioned resistance for warm pure water evaluation method.

TABLE 7

| | Test item | Example 21 | Compar. Ex. 9 |
|---|---|---|---|
| (2-1) | 50% mean pigment particle diameter | 0.066 μm | 0.071 μm |
| (2-2) | Mode of development | Dissolution type | Peeling type |
| | Developing time | 20 sec. | 25 sec. |
| | Y value($0.05 \leq x \leq 0.30$, $0.05 \leq y \leq 0.30$) | 20.8 | 18.0 |
| | Y value after heat resistance testing/ | 98.6% | 96.4% |

TABLE 7-continued

| | Test item | Example 21 | Compar. Ex. 9 |
|---|---|---|---|
| | Y value before testing | | |
| | Cross section (angle) | 48.6° | 98° |
| (2-3) | Visual observation for residue | No residue | Residue found |
| | Residue wiping test | No residue | Residue found |
| (2-4) | Contrast ratio | 2500 | 1800 |
| (2-5) | Adherence | Deficiency at ≦20 μm | Deficiency at ≦35 μm |
| | Resolution | ≦20 μm | ≦55 μm |
| | Cross cut peel test | ○ | Δ |

EXAMPLE 22

The procedure of Example 21 was followed in the same manner except that the copolymer 10 solution produced in Example 16 was used in lieu of the copolymer 7 solution. The results are shown in Table 8.

COMPARATIVE EXAMPLE 10

A comparative blue pigment dispersion composition (C2) was prepared in the same manner as in Example 22 except that the composition thereof was the blue pigment dispersion composition minus the copolymer 10 solution. Further, a comparative blue resist (C2) was prepared in the same manner as in Example 21 except that the equal amount of an acrylic resin (trademark "B-7500", product of Shin-Nakamura Chemical) was used in lieu of the copolymer 7 solution.

TABLE 8

| | Test item | Example 22 | Compar. Ex. 10 |
|---|---|---|---|
| (2-1) | 50% mean pigment particle diameter | 0.066 μm | 0.071 μm |
| (2-2) | Mode of development | Dissolution type | Peeling type |
| | Developing time | 20 sec. | 25 sec. |
| | Y value(0.05 ≦ x ≦ 0.30, 0.05 ≦ y ≦ 0.30) | 20.8 | 18.0 |
| | Y value after heat resistance testing/Y value before testing | 98.6% | 96.4% |
| | Cross section (angle) | 48.6° | 98° |
| (2-3) | Visual observation for residue | No residue | Residue found |
| | Residue wiping test | No residue | Residue found |
| (2-4) | Contrast ratio | 2500 | 1800 |
| (2-5) | Adherence | Deficiency at ≦20 μm | Deficiency at ≦35 μm |
| | Resolution | ≦20 μm | ≦55 μm |
| | Cross cut peel test | ○ | Δ |

EXAMPLE 23

Preparation of Curable Resin Composition 16

A curable resin composition (16) was prepared following the same procedure as in Example 4 except that the copolymer 7 produced in Example 13 was used in lieu of the copolymer 1. The curable resin composition 16 was evaluated by the following method. The results are shown in Table 9.

Cured Film Physical Property and Yellowing Tendency Evaluation

The curable resin composition 16 obtained in Example 23 was applied onto a 10-cm-square glass substrate using a spin coater (product of MIKASA, model 1H-DX2), and dried to give a coat film having a dry film thickness of 1.2 μm. This film was heated on a hot plate at 90° C. for 3 minutes. After heating, the film was irradiated with ultraviolet rays at an intensity of 100 mJ/cm$^2$ (as illuminance at 405 nm) using a UV aligner (product of Dainippon Screen Mfg. Co., model MA 1200) equipped with a 2.0-kW ultrahigh pressure mercury lamp.

After ultraviolet irradiation, the coat film was dried in a clean oven (product of Oshitari Laboratory, trademark "SCOV-250 Hy-So") at 230° C. for 30 minutes to give a 1.0-μm-thick cured film. The chromaticity of the thus-obtained cured film on the glass substrate was measured using a colorimeter (product of Olympus Optical Co., trademark "OSP-SP200"), using the glass substrate as a reference.

Then, the cured film-carrying glass substrate after measurement was irradiated with ultraviolet rays and washed in a UV ozone washer at an intensity of 6.7 J/cm$^2$ (as illuminance at 405 nm) and further heated in a clean oven (product of Oshitari Laboratory, trademark "SCOV-250 Hy-So") at 250° C. for 1 hour to give a cured film for heating testing. The chromaticity of the thus-obtained cured film on the glass substrate was measured using a colorimeter (product of Olympus Optical Co., trademark "OSP-SP 200"), using the glass substrate as a reference.

The heat resistance of the cured film was evaluated in terms of the change in chromaticity after the above heating testing as compared with the value before testing.

The color difference ΔEab referred to therein is the value obtained by the color difference equation given below for the CIE 1976 (L*, a*, b*) space color system (The Color Science Association of Japan (ed.): Shinpen Shikisai Kagaku Handobukku (Color Science Handbook, new edition) (1985), page 266).

$$\Delta Eab = \{(\Delta L)^2 + (\Delta a)^2 + (\Delta b)^2\}^{1/2}$$

EXAMPLE 24

The same procedure as in Example 23 was followed except that the copolymer 10 obtained in Example 16 was used in lieu of the copolymer 7 obtained in Example 13. The results are shown in Table 9.

TABLE 9

| | | Example 23 | Example 24 |
|---|---|---|---|
| | Double bond equivalent | 486 | 486 |
| Curable | Hardness at 180° C. | 245 | 40 |
| resin | Elastic deformation modules(%) | 33 | 33 |
| composition | Developability | ⊚ | ⊚ |
| | Coat film surface roughening | ⊚ | ⊚ |
| | Resistance for warm pure water | ○ | ○ |
| | Color difference after heating (ΔEab) | 0.952 | 0.986 |

INDUSTRIAL APPLICABILITY

The alkali-soluble maleimide-based copolymer of the present invention having the above constitution is capable of yielding a coat film which is not only excellent in the resistance for thermally yellowing and in hardness but also uniform throughout because of its good solubility in solvents and, in addition, in uncured state, is well soluble in alkali water. Furthermore, it is excellent in pigment dispersing ability. The ionizing radiation-curable resin composition comprising such alkali-soluble maleimide-based copolymer is excellent in transparency and resistance for yellowing and, when developed, gives a good curing product excellent in patterning accuracy and in physical properties without forming residues, and, therefore can be used as a material for forming various thin layers or patterns included in color filters. Since it can form not only parts requiring no transparency but also parts requiring transparency, such as protective layers and colored layers, it can form the colored layer, protective layer and spacers in color filters and is particularly suited for use as a material for forming blue pixels. Such color filters and liquid crystal displays comprising the same are superior in pixel transparency and pattern accuracy, among others.

The invention claimed is:

1. An alkali-soluble maleimide-based copolymer which comprises, as essential constituents, 5 to 50% by mass of a maleimide monomer unit which is at least one unit selected from the group consisting of a N-cyclohexylmaleimide monomer unit, a N-benzylmaleimide monomer unit and a substituted N-benzylmaleimide monomer unit, 8 to 30% by mass of the (meth)acrylic acid monomer unit and 30 to 87% by mass of a (meth)acrylic acid ester monomer unit and which satisfies the condition represented by the formula:

$$0.4 \times X \leq Y \leq 0.5 \times X + 10$$

where X is the content, in % by mass, of the N-cyclohexylmaleimide monomer unit, the N-benzylmaleimide monomer unit and the substituted N-benzylmaleimide monomer unit and Y is the content, in % by mass, of the (meth)acrylic acid monomer unit, wherein the alkali-soluble maleimide-based copolymer has a double bond equivalent of 300 to 100,000.

2. A pigment dispersion composition which comprises at least one or more pigments selected from the group consisting of blue pigments and phthalocyanine pigments, the alkali-soluble maleimide-based copolymer according to claim 1, a dispersant and a solvent.

3. The pigment dispersion composition according to claim 2, wherein the mixing ratio of the dispersant to the sum of pigments including the pigment selected from the group consisting of blue pigments and phthalocyanine pigments is not more than 0.5 by mass.

4. An ionizing radiation-curable resin composition which comprises the alkali-soluble maleimide-based copolymer according to claim 1, a radical-polymerizable compound and a photopolymerization initiator.

5. A color filter which comprises a transparent substrate and a colored layer formed on said transparent substrate as essential constituents, optionally further comprises a protective layer covering said colored layer and/or a spacer disposed at sites overlapping with non-displaying sites on said transparent substrate for maintaining the distance to the opposing electrode substrate wherein at least one of the colored layer, protective layer and spacer is formed by curing the ionizing radiation-curable resin composition according to claim 4.

6. The ionizing radiation-curable resin composition according to claim 4 which comprises at least one or more pigments selected from the group consisting of blue pigments and phthalocyanine pigments.

7. The ionizing radiation-curable resin composition according to claim 6 which can form a cured film having a thickness of 1.35 μm after curing and capable of displaying a color space whose x coordinate covers the range of $0.05 \leq x \leq 0.30$, whose y coordinate covers the range of $0.05 \leq y \leq 0.30$ and whose stimulus value Y is not less than 20 in a C light source colorimetric XYZ color system determined under 2-degree visual field.

8. The ionizing radiation-curable resin composition according to claim 6 which can form a cured film which, when measured, at a thickness of 1.3 μm after curing, for stimulus value Y at y=0.1400 in a C light source colorimetric XYZ color system determined under 2-degree visual field before and after 1 hour of heating at 250° C., gives a ratio of the measured value Y2 after heating to the measured value Y1 before heating, (Y2/Y1)×100, of not less than 97%.

9. The ionizing radiation-curable resin composition according to claim 6 which can form a cured film with a contrast ratio of not less than 2,000.

10. The ionizing radiation-curable resin composition according to claim 6 which can form a cured film with a cross-sectional rising angle of not more than 50° relative to the coated surface.

11. A color filter which comprises a colored layer formed by curing the ionizing radiation-curable resin composition according to claim 6.

12. The ionizing radiation-curable resin composition according to claim 4 which when exposed, in the form a 1.0-μm-thick cured film, to ultraviolet rays from an ultrahigh pressure mercury lamp and further heated at 250° C. for 1 hour, shows a color difference (ΔEab) of not more than 2.0 after the above series of treatments.

13. A color filter which comprises a transparent protective layer formed by curing the ionizing radiation-curable resin composition according to claim 12.

14. The ionizing radiation-curable resin composition according to claim 4 which, in the form of a 5-μm-thick cured film formed on a transparent substrate, shows, at 180° C., a universal hardness of not less than 200 N/mm² and an elastic deformation modulus of not less than 30%.

15. A color filter which comprises pillar-like spacers formed by curing the ionizing radiation-curable resin composition according to claim 14.

16. A liquid crystal display which comprises the color filter according to claim 5, an electrode substrate opposing thereto, and a liquid crystal compound sealed between both.

17. A pigment dispersion composition which comprises at least one or more pigments selected from the group consisting of blue pigments and phthalocyanine pigments, the alkali-soluble maleimide-based copolymer according to claim 1, a dispersant and a solvent.

18. An ionizing radiation-curable resin composition which comprises the alkali-soluble maleimide-based copolymer according to claim 1, a radical-polymerizable compound and a photopolymerization initiator.

19. A color filter
which comprises a colored layer formed by curing the ionizing radiation-curable resin composition according to claim 7.

20. The alkali-soluble maleimide-based copolymer according to claim 1
wherein the double bond occurs on side chains of the alkali-soluble maleimide-based copolymer.

21. The ionizing radiation-curable resin composition according to claim 4
wherein the radical-polymerizable compound is a photopolymerizable compound having three or more ethylenically unsaturated double bonds per molecule.

* * * * *